United States Patent [19]

Ina

[11] Patent Number: 4,937,459

[45] Date of Patent: Jun. 26, 1990

[54] ALIGNMENT SIGNAL DETECTING DEVICE

[75] Inventor: Hideki Ina, Yokohama, Japan

[73] Assignee: Canon Kabushiki Kaisha, Tokyo, Japan

[21] Appl. No.: 319,820

[22] Filed: Mar. 6, 1989

Related U.S. Application Data

[63] Continuation of Ser. No. 244,568, Sep. 12, 1988, abandoned, which is a continuation of Ser. No. 82,937, Aug. 6, 1987, abandoned, which is a continuation of Ser. No. 798,321, Nov. 15, 1985, abandoned.

[30] Foreign Application Priority Data

| Nov. 16, 1984 | [JP] | Japan | 59-240421 |
| Nov. 20, 1984 | [JP] | Japan | 59-243515 |
| Dec. 5, 1984 | [JP] | Japan | 59-255588 |
| Dec. 5, 1984 | [JP] | Japan | 59-255589 |

[51] Int. Cl.⁵ .................... G01N 21/86; G01B 11/00
[52] U.S. Cl. .................... 250/548; 250/225; 356/401
[58] Field of Search ............ 250/225, 548; 356/375, 356/399, 400, 401

[56] References Cited

U.S. PATENT DOCUMENTS

| 4,563,094 | 1/1986 | Yamada | 356/401 |
| 4,579,453 | 4/1986 | Makita | 250/548 |
| 4,611,122 | 9/1986 | Nakano et al. | 250/548 |
| 4,641,035 | 2/1987 | Suzuki et al. | 250/548 |
| 4,645,924 | 2/1987 | Suzuki et al. | 250/236 |
| 4,659,228 | 4/1987 | Totsuka et al. | 356/401 |
| 4,669,883 | 6/1987 | Ina et al. | 356/401 |

FOREIGN PATENT DOCUMENTS 54-47668  4/1979  Japan.

*Primary Examiner*—Steven Mottola
*Attorney, Agent, or Firm*—Fitzpatrick, Cella, Harper & Scinto

[57] ABSTRACT

An alignment signal detecting device including a polarization-plane rotating element and a polarization beam splitter, co-operative to selectively define different optical paths for the same alignment beam, optical elements disposed on respective optical paths and effective to detect an alignment signal from an alignment mark with an improved detection accuracy, and a control unit for controlling the polarization plane rotating element to change the plane of polarization so as to assure detection of the alignment signal from the alignment mark in a most suitable manner.

7 Claims, 11 Drawing Sheets

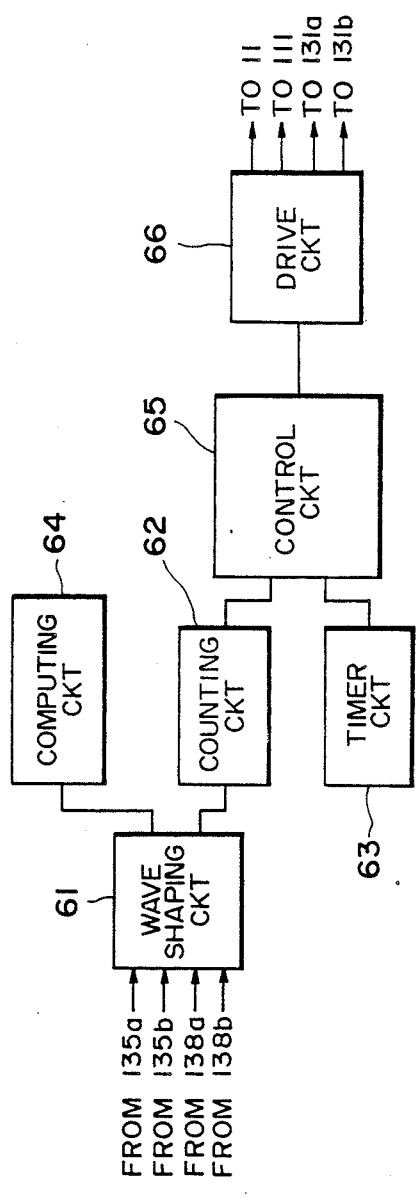
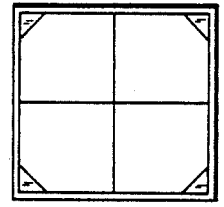
FIG. 10
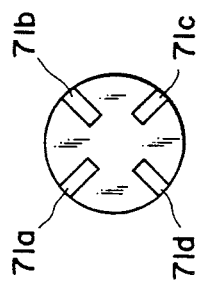
FIG. 9
FIG. 8

ALIGNMENT SIGNAL DETECTING DEVICE

This application is a continuation of application Ser. No. 244,568, filed Sept. 12, 1988, now abandoned, which is a continuation of application Ser. No. 082,937 filed Aug. 6, 1987, now abandoned, which is a continuation of application Ser. No. 798,321, filed Nov. 15, 1985, now abandoned.

FIELD OF THE INVENTION AND RELATED ART

This invention relates to an alignment signal detecting device usable, for example, in a microcircuit manufacturing exposure apparatus, for aligning two objects such as a mask and a wafer In some alignment systems used in micro-circuit manufacturing exposure apparatuses, alignment marks formed on a mask and a wafer, respectively, are scanned by a laser beam to detect respective positions of these marks thereby to detect the positional relation between the mask and the wafer.

An example of such alignment marks of the mask and the wafer is schematically shown in FIG. 1. Illustrated in an uppermost portion of FIG. 1 is an alignment mark formed on the mask. As illustrated, the mask alignment mark comprises first and second parallel mark elements M1 and M2 each inclined with an angle $\theta$ relative to a scanning line A and third and fourth parallel mark elements M3 and M4 each inclined oppositely, as compared with the mark elements M1 or M2, relative to the scanning line A with the same angle $\theta$. Illustrated in a portion (b) of FIG. 1 is an alignment mark formed on the wafer. As illustrated, the wafer alignment mark comprises first and second mark elements W1 and W2 which are oppositely inclined relative to the scanning line A with the same angle $\theta$. In a position detecting operation, the mask alignment mark and the wafer alignment mark are superposingly observed and scanned, such as shown in a portion (c) of FIG. 1, to detect the relative position of the mask and the wafer.

When, in the state shown in the portion (c) of FIG. 1, the alignment marks are scanned along the scanning line A by a laser beam scanningly deflected by an optical scanning mechanism, the laser beam is scatteringly reflected by each of the mark elements M1-M4, W1 and W2. The scatteringly reflected laser beam is detected by a photoreceptor, whereby pulse signals such as shown in a portion (d) in FIG. 1 and having positions, with respect to time, corresponding to the positions of th mark elements M1, W1, M2, M3, W2 and M4 on the scanning line A are produced. These pulse signals are sliced by a comparator with an appropriate threshold voltage, whereby a pulse train comprising a series of rectangular pulses such as shown in a portion (e) in FIG. 1 is produced. By measuring the pulse spacings with respect to time, the positional relation between the mask alignment mark and the wafer alignment mark is calculated. Then, the relative positional deviation of these alignment marks is detected and, on the basis of the result of detection, the mask and the wafer are relatively moved by a driving system into a predetermined positional relation, i.e. into proper alignment.

As for the scanning laser beam, it has been proposed to use a spot-like laser beam, such as disclosed in Japanese Laid-Open Patent Application, Laid-Open No. 90872/1978. Use of such spot-like laser beam, however, involves a problem that the alignment is not possible or the accuracy of alignment is deteriorated if any foreign particles or any particles of aluminum material forming the alignment marks are adhered to a portion of the mask or wafer surface corresponding to the scanning line, or if the mask or wafer alignment mark is partially in defect.

Various proposals have been made to obviate the problem peculiar to the optical scanning with the spot-like laser beam. An example is disclosed in Japanese Laid-Open Patent Application, Laid-Open No. 82248/1983 filed by the same assignee of the subject application. According to this proposal, alignment marks of a mask and a wafer are scanned by a sheet-like beam which is a beam adapted to define, on the surface to be scanned, an elongated illumination area like a slit. Hereinafter, the sheet-like beam will be also referred to as "slit-like beam". By a wider-area scanning with such sheet-like beam, the adverse effect of existence of any foreign particles or any defect in the mark element is particularly alleviated. Since, however, the sheet-like beam must have an inclination which is the same as that of the mark element to be detected (as viewed on the surface to be scanned), it is necessary to change the inclination of the sheet-like beam so that it coordinates with each of the inclinations of the mark elements M1, W1, M2, M3, W2 and M4. For this reason, in one embodiment disclosed in the aforementioned Japanese Patent Application, the alignment system is provided with two cylindrical lenses adapted to define two sheet-like beams having different inclinations and these cylindrical lenses are interchanged mechanically in such manner that one is used in a first scanning operation to detect the mark elements M1, W1 and M2 and then another is used in a second scanning operation to detect the mark elements M3, W2 and M4. That is, a series of mark elements are detected by two scanning operations. Therefore, a longer time is required to detect all the alignment marks.

Another example is disclosed in Japanese Laid-Open Patent Application, Laid-Open No. 99921/1984. According to this proposal, mark elements of the mask and the wafer alignment marks, such as M1, W1, M2, M3, W2 and M4 shown in FIG. 1, are scanned with two crossed sheet-like beams having different inclinations coordinating with those of the mark elements. This type of scan will be hereinafter called as "cross-beam type scan". As disclosed in one embodiment of this Japanese Patent Application, however, the two sheet-like beams must have different states of polarization in order to assure discrimination of the mark elemens having different inclinations. This leads to limitations to the geometrical design of the scanning optical system or of an apparatus to which the alignment system is to be incorporated.

For example, in a case of such an exposure apparatus having a projection optical system interveningly disposed between a mask (or a reticle) and a wafer, and where a light beam which is reflected directly from the mask surface and a light beam which is diffractively transmitted through the mask to the wafer and reflected by the wafer surface are detected simultaneously, there will occur variation in the amplitude of the signals detected, such as shown in the portion (d) in FIG. 1, corresponding to the mark elements M1, W1 and M2. Such variation in the amplitude leads to deterioration of the accuracy of the position detection or to an erroneous operation. The variation in the amplitude results from variation in the relation, with respect to phase, between the light beams reflected from the mask and from the wafer which is caused by a minute change in the state of the optical path between the mask and the wafer due to heat from the exposure beam or the like. In view of this, it has been proposed to utilize polarization in order to separate optical signals from the mask and from the wafer. Since, however, the polarization has to be utilized to separate the optical signals, according to this proposal, it is not possible to apply, to the proposed alignment system, the afore-mentioned cross-beam type scanning process in which two sheet-like beams having different states of polarization are to be projected.

Also, where the cross-beam type scanning process is to be incorporated, a half mirror is used in order that a mark scanning beam and a reflection beam from the mark may travel along the same path and that the reflection beam from the mark may be separated. In such case, the intensity of the laser beam emitted from a laser source is decreased by the half mirror to a half level before it illuminates the mark, and the decreased intensity is further reduced to its half level when the reflection beam from the mark is separated from the scanning beam. As a result, only a quarter of the output of the laser can be used for the sake of detection of the mark. Accordingly, for the same laser output, the signal-to-noise ratio of the detected signal is degraded which leads to deterioration of the position detecting accuracy or leads to a higher possibility of an erroneous operation. In addition, approximately a half of the reflection beam from the mark is directed back to the laser source. This is not preferable because, if the level of such returning beam is high, the output level or the oscillation frequency of the laser source will be varied.

In view of such a problem, it has been proposed in Japanese Patent Application No. 48091/1983 filed by the same assignee of the subject application that mark elements such as M1, W1, M2, M3, W2 and M4 shown in FIG. 1 are scanned by two sheet-like beams which have different inclinations coordinating the inclinations of the mark elements and which are spaced from each other by an interval when they are incident on the surface to be scanned. While this type of scanning method maintains a freedom in respect to setting the direction of polarization, a similar disadvantage still remains in the point that only a half of the laser output is available for the sake of detection of the alignment marks because a single laser output is divided into two to simultaneously form two sheet-like beams having different inclinations. Accordingly, similarly to the above-described case, the signal-to-noise ratio will be deteriorated for the same laser output.

There is another factor for the degradation in the position detecting accuracy. This is a prism action of a photoresist layer applied to a wafer. That is, a scatteringly reflected light from the wafer is adversely effected by the prism action of the resist layer, such that the accurate detection is hindered. As a solution for such problem, it has been proposed in Japanese Patent Application No. 159652/1983 filed by the same assignee of the subject application that, in accordance with the structure of a pattern (mark) formed on an object having a transparent coating, i.e. according to whether the pattern is defined by a recess or protrusion, only such light rays as scatteringly (diffractively) reflected from edges of the pattern and advancing only in predetermined directions are detected and that signals obtained thereby are combined to form a pattern detection signal.

If, for example, the mark elements to be detected have two kinds of inclinations, a spatial filter (stopper) having formed therein four slit-like light-transmitting portions 71a, 71b, 71c and 71d (see FIG. 9) extending in predetermined directions is disposed on a Fourier transform plane for the mask and the wafer, thereby to effect spatial-frequency filtering. The light beams passed through the light-transmitting portions 71a–71d of the spatial filter i.e. the light beams separated into discrete components corresponding to the directions of scattering reflection, are independently detected by a photodetector having a light-receiving surface which is optically and electrically divided into four discrete regions, such as shown in FIG. 10. However, there remain such inconveniences that an exact precision is required for each of the parts such as the spatial filter and the photodetector and that adjustment of mounting position as well as adjustment of angle require complicated labors.

In another aspect, where an exposure apparatus is provided with a projection lens interveningly disposed between a mask (or a reticle) and a wafer as described in the foregoing, the projection lens is usually designed to assure an optimum image-formation state relative to the wavelength of an exposure beam. If, therefore, a laser beam having a wavelength different from that of the exposure beam is used to scan alignment marks, the laser beam is not sharply focused but is defocused on the wafer surface due to chromatic aberration. Therefore, scanning the wafer alignment mark with such a laser beam will result in an increased pulse width of a signal detected from a scatteringly reflected light, so the positional accuracy is deteriorated. For example, when a g-line (436 nm) of a super Hg lamp is used as the exposure beam while a beam of an He-Ne laser (633 nm) is used as the alignment beam, there will occur a deviation of 0.5–0.6 mm with respect to the focal point position.

To obviate such a problem, various proposals have been made, such as:

(1) To use such a projection lens in which aberrations are corrected with respect to two wavelengths so that the same imaging position is defined relative to the exposure beam and the alignment laser beam.

(2) To change the position of the wafer, the reticle or the projection lens, during the alignment operation, by an amount corresponding to the difference in the image-forming relation with respect to the exposure beam and the alignment beam.

(3) To use such an alignment beam as having a wavelength equal to or close to that of the exposure beam.

In the case of proposal (1), however, a curve showing the relation between the wavelength and the focal length has a very steep inclination, particularly in the vicinity of the wavelength of the exposure beam. If, therefore, a light beam having a substantial wavelength range, not having a single wavelength, such as the beam of g-line of the super Hg lamp is used for the exposure, the resolving power would be decreased.

In the case of proposal (2), two additional operations are required, such as shifting, for example, the wafer to an alignment position prior to the exposure and moving the wafer back to the exposure position prior to the exposure. This leads to reduction in the throughput.

In the case of proposal (3), if, by an error, the area of exposure is scanned with the alignment beam, the resist material in the scanned region is sensitized which critically affects the characteristics of finally produced semiconductor devices. Also, where a multi-layer resist coating which has recently been widely used so as to improve the resolving power is employed, it is very difficult or impossible to achieve alignment because an extraordinarily small amount of light is reflected from the wafer. Further, if a beam of very short wavelength such as an excimer laser, providing a wavelength of 208 nm, for example, is used as the exposure beam, it may not be possible to get a suitable alignment beam source of continuous emission type for producing a light beam of a wavelength equal to or close to that of the exposure beam.

SUMMARY OF THE INVENTION

In view of such problems as described in the foregoing, it is a primary object of the present invention to provide an alignment signal detecting device by which the positional relation between two objects as represented by the positional relation between alignment marks formed on these objects can be detected with high accuracies, and which has a structure allowing easy adjustment of the components and allowing tolerated precision for the components. Particularly, the invention aims at providing an alignment signal detecting device suitable for use in an exposure apparatus of such type in which the exposure is effected through an optical system.

It is another object of the present invention to provide an alignment signal detecting device which allows high-speed and high-accuracy detection of alignment marks with the use of a light beam having a wavelength different from that of an exposure beam.

Briefly, according to the present invention, to achieve these objects, there is provided an alignment signal detecting device including a polarization-plane rotating element and a polarization beam splitter, cooperative to selectively define different optical paths for the same alignment beam, optical elements disposed on respective optical paths and effective to detect an alignment signal from an alignment mark with an improved detection accuracy, and a control unit for controlling the polarization plane rotating element to change the plane of polarization so as to assure detection of the alignment signal from the alignment mark in a most suitable manner.

More specifically, according to one aspect of the present invention, there is provided an alignment signal detecting device for scanning, with a slit-like light beam, alignment marks formed by elongated mark elements having different inclinations to detect a signal related to the relative position of the alignment marks, the device comprising: means for producing a polarized light beam; polarization plane rotating means selectively operative on the polarized light beam produced by the producing means to rotate a plane of polarization of the polarized light beam; means for controlling the polarization plane rotating means so that polarized light beams having different planes of polarization are in accordance with the inclinations of the mark elements of the alignment marks outputted from the polarization plane rotating means; first deflecting means selectively operative on the polarized light beams outputted from the polarization plane rotating means, to transmit one of the polarized light beams and to reflect another of the polarized light beams, thereby to direct them along different paths; optical means operative on the polarized light beams directed along the different paths, for forming them into slit-like light beams having different inclinations; and second deflecting means selectively operative on the slit-like light beams formed by the optical means, for transmitting one of the slit-like light beams and for reflecting the other of the slit-like light beams, in accordance with the direction of polarization, thereby to direct them in the same direction.

According to another aspect of the present invention, there is provided an alignment signal detecting device for scanning, with a light beam, alignment marks formed by elongated mark elements having different inclinations to detect a signal related to the relative position of the alignment marks, the device comprising: a detection optical system for scanning the alignment marks with a light beam and for detecting scatteringly reflected lights from the alignment marks advancing in particular directions in accordance with the inclinations of the alignment marks; the detection optical system including optical path selecting means operative to direct each of the scatteringly reflected lights from the alignment marks along a selected one of different optical paths defined in accordance with the inclinations of the alignment marks, stopper members each disposed on a corresponding one of the optical paths and at a position at which a corresponding one of the scatteringly reflected lights is substantially imaged, each of the stopper members having a light-transmitting portion formed so as to transmit only a scatteringly reflected component, of the reflected light directed along the corresponding optical path, which component corresponds to the inclination of an associated one of the mark elements having different inclinations, and photoelectric detectors provided for the optical paths, respectively, each of the photoelectric detectors being adapted to detect the quantity of light passed through a corresponding one of the stopper members.

According to a further aspect of the present invention, there is provided an alignment signal detecting device for scanning an alignment mark formed on an original and for scanning an alignment mark formed on an image bearing member, through a projection lens for projecting an image of the original onto the image bearing member, both with a light beam having a wavelength different from that of a light beam used for transferring the image of the original onto the image bearing member, the device comprising: a dual-focus optical system operative to focus the light beam on the original when the alignment mark on the original is to be detected, and operative to focus the light beam on the image bearing member when the alignment mark on the image bearing member is to be detected; and control means for interchangingly setting the focus of the dual-focus optical system.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 8 is a block diagram of a control system employed in the device of FIG. 7.

FIG. 9 is a plan view showing an example of a spatial filter.

FIG. 10 is a plan view showing an example of a light-detecting surface of a photoelectric converting element.

DETAILED DESCRIPTION OF THE PREFERRED EMBODIMENTS

Figure 1:
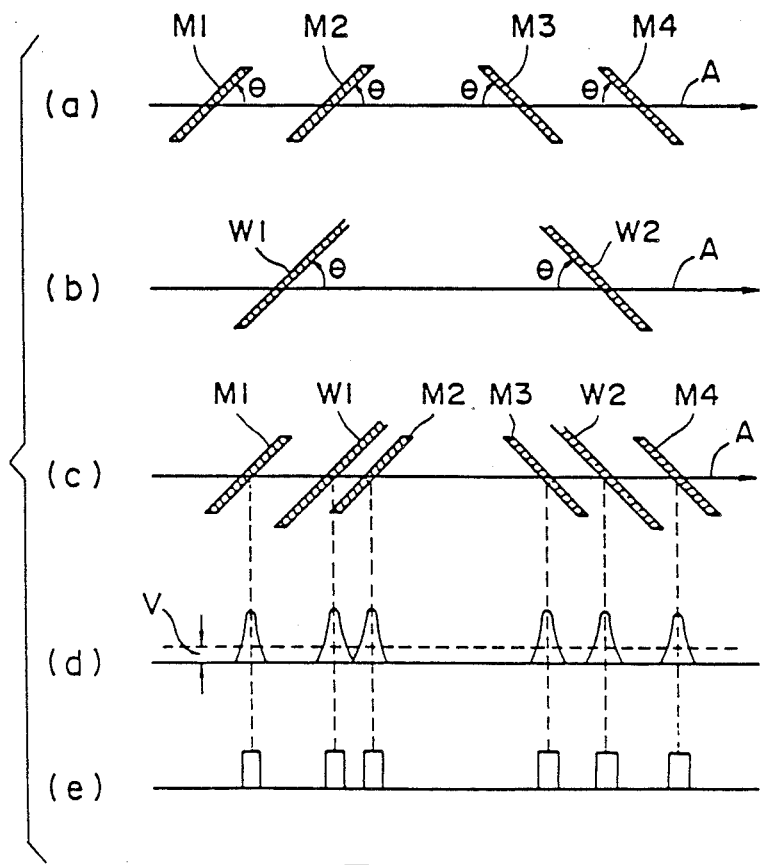
FIG. 1 is a schematic view showing alignment marks and the manner of detecting the same, according to the prior art.
Figure 2:
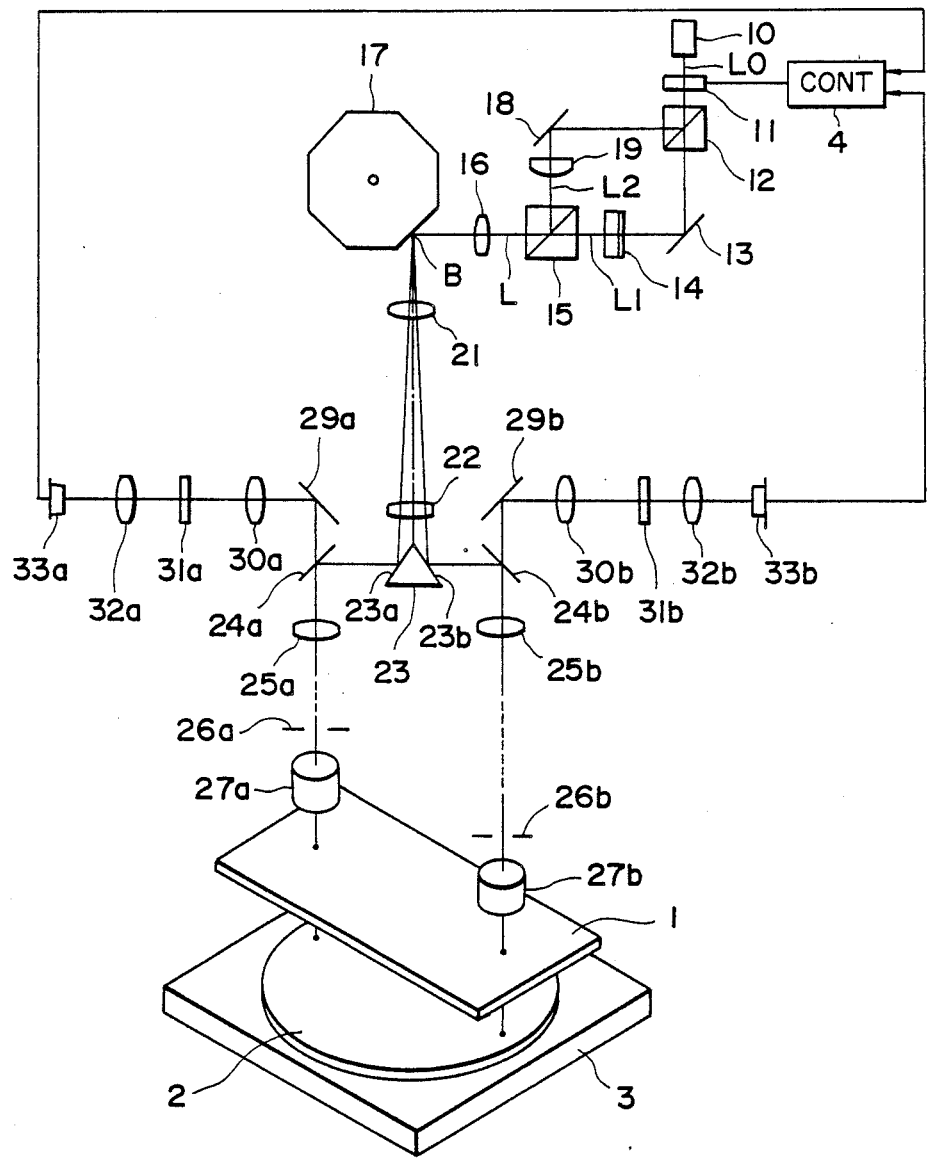
FIG. 2 is a schematic and diagrammatic view showing an optical arrangement of an alignment signal detecting device according to one embodiment of the present invention.

Referring to FIG. 2, there is shown an optical arrangement of an alignment signal detecting apparatus according to an embodiment of the present invention, wherein designated by reference numerals 1 and 2 are a mask (or reticle) and a wafer, respectively. The wafer 2 is carried on a wafer stage 3. On the mask 1 and the wafer 2, alignment marks M (M1, M2, M3 and M4) and W (W1 and W2) as shown in FIG. 1(a) and FIG. 1(b) are formed. Those marks are physically or optically superimposed as shown in FIG. 1 (c). The apparatus of FIG. 2 includes a control system 4 for controlling operation of the entire apparatus in accordance with a predetermined sequence.

The apparatus comprises a laser source 10 which produces a P-polarized beam having a polarization plane which is parallel to the surface of the drawing, and includes a polarization plane rotating element 11 for rotating the direction of polarization of the beam incident thereon in accordance with a voltage applied thereto. The polarization plane rotating element 11 emits the laser beam as it is (P-polarization) when no voltage is applied from the control system 4. When, however, a predetermined voltage is applied from the control system 4 to the element 11, the element 11 rotates the polarization plane by 90 degrees so as to emit an S-polarized beam having a polarization plane which is perpendicular to the surface of the drawing. In other words, the polarization plane rotating element 11 functions as a halfwave plate when a predetermined voltage (which will be called hereinafter "a halfwave length voltage") is applied. As an example of this element 11, this is an electro-optic ceramic (PLZT) available from MOTOROLA, U.S.A. as No. 9065 for shutters. This includes comb-like electrodes on both sides. The halfwave voltage of the PLZT 9065 is 556.8 (v) which is calculated from the available specifications.

Along the optical path of the P-polarized beam emitted from the polarization plane rotating element (which will be hereinafter called simply "PLZT") 11, there are a first polarization beam splitter 12 for transmitting a P-polarized beam and reflecting an S-polarized beam, a reflection mirror 13, a first cylindrical lens 14 having an axis inclined at 45 degrees with respect to the surface of the drawing to produce a flat beam, a second beam splitter 15 for transmitting a P-polarized beam and reflecting an S-polarized beam, an imaging lens 16 and a rotatable polygonal mirror 17. The S-polarized beam from the PLZT 11 after being subjected to the polarization rotating operation thereof, is reflected by the first polarization beam splitter 12; is reflected by a reflection mirror 18; is transmitted through a second cylindrical lens 19 having a power axis which is perpendicular to the power axis of the first cylindrical lens 14 (45 degrees with respect to the surface of the drawing) to produce a flat beam; is reflected by the second polarization beam splitter 15 and is incident on the mirror surface of the rotatable polygonal mirror 17. The optical axis along which the P-polarized beam is incident on the polygonal mirror 17 is the same as that along which the S-polarized beam is incident thereon.

Along the optical path of the beam scanningly deflected by the polygonal mirror 14, there are arranged intermediate lenses 21 and 22 and a prism 23 for deflecting the laser beam L oppositely perpendicularly in accordance with the scanning angle. The optical system downstream of the prism 23 is symmetrical, and each includes a half mirror 24a (24b) for deflecting the laser beam L and directing the returning light to a photoelectric detecting system, an intermediate lens 25a (25b), an aperture stop 26a (26b) and an objective lens 27a (27b). The returning beams are transmitted through the respective half mirrors 24a and 24b. Along the optical path for each of the beams transmitted through the half mirror 24a or 24b, there are symmetrically arranged reflecting mirrors 29a and 29b, imaging lenses 30a and 30b, partial light blocking members 31a and 31b each having a light blocking portion only adjacent the center thereof, condenser lenses 32a and 32b and photoelectric transducers 33a and 33b. Thus, the two symmetrical photoelectric detection systems are established.

The control system 4 controls the inclination of the illumination area provided by the flat laser beam L on the surface to be scanned on the basis of output signals produced by the photoelectric transducers 33a and 33b.

Figure 3:
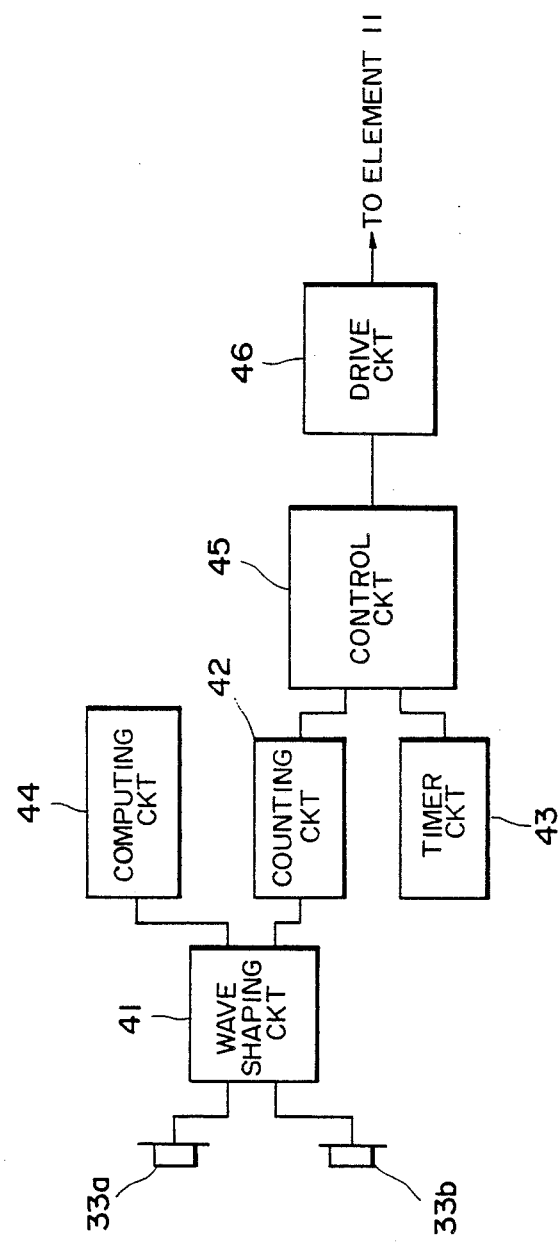
FIG. 3 is a block diagram of a control system employed in the device of FIG. 2.

FIG. 3 is a block diagram of the control system 4 which includes a waveform shaping circuit 41, a counter circuit 42, a timer circuit 43, a processing circuit 44, a control circuit 45 and a driving circuit 46. The output signals from the photoelectric transducers 33a and 33b are transmitted to the control circuit 45 through the waveform shaping circuit 41 and the counter circuit 42. To the control circuit 45, the timer circuit 43 is also connected. The control circuit 45 is connected to the polarization plane rotating element 11 through a driving circuit 46. To the processing circuit 44, pulse signals produced by the waveform shaping circuit 41 is introduced, and the state of alignment or misalignment is determined by the computing or processing circuit 44.

In operation, when the voltage is not applied to the PLZT 11, the P-polarized light L0 produced by the laser source 10 is emitted from the PLZT 11 which does not rotate the polarization plane, so that the beam is still P-polarized. The beam L0 is transmitted by the polarization beam splitter 12; is directed leftwardly by the reflection mirror 13; is reformed into a flat beam L1 having an elongate cross-section (slit-like) by the second cylindrical lens 14; is transmitted through the second polarization beam splitter 15; and is incident on the origin B of deflection of the rotatable polygonal mirror 17.

When, on the other hand, the voltage is applied to the PLZT 11, the P-polarized beam L0 produced by the laser source 10 is converted to an S-polarized beam by the polarization rotation operation of the PLZT 11 which rotates the polarization plane by 90 degrees. Therefore, the beam is then reflected by the polarization beam splitter 12 and is deflected by the deflection mirror 18 downwardly as seen in FIG. 2. The S-polarized laser beam reflected by the reflecting mirror 18 is reformed by the second cylindrical lens 17 into a flat beam having an elongated cross-section (slit-like) extending in the direction perpendicular to that of the beam L1. The thus produced flat beam L2 is incident on the second polarization beam splitter 15, where it is directed by reflection in the same direction as the beam L1 and along the same optical path as the beam L1 so that it is incident on the original B of deflection of the polygonal mirror 17.

The laser beam L1 scanningly deflected by the polygonal mirror 17 passes through the intermediate lenses 21 and 22, and thereafter is incident on one side surface 23a of the prism 23, by which it is deflected leftwardly to the half mirror 24a and is deflected downwardly thereby. The beam is imaged on the mask 1 and wafer 2 through the intermediate lens 25a, the aperture stop 26a and the objective lens 27a. The beam imaged on the mask 1 and the wafer 2 illuminates the first alignment mark group on the surfaces of the mask 1 and the wafer 2 by a slit-like illumination area extending parallel to the alignment marks M1, W1 and M2.

When the slit-like illumination area 1 scans along a scanning line A-rightwardly as seen in this Figure, the illumination light is scattered at the positions corresponding to the alignment marks M1, W1 and M2. The light scattered by the alignment marks M1, W1 and M2 is returned through the objective lens 27a, the aperture stop 26a and the intermediate lens 25a. The returning beam is transmitted through the half mirror 24a, is reflected by the reflecting mirror 29a and further transmitted through the imaging lens 30a, the partial light blocking plate 31a and the condenser lens 32a and is incident on the electrophotographic transducer 33a, which produces output signals S1, S2 and S3 as shown in FIG. 4(b) corresponding to the alignment marks M1, W1 and M2. In this operation, the slit-like illumination area 1 is substantially superimposing on the alignment marks M1, W1 and M2, the accuracy of the mark detection is improved as compared with the case where a spot beam is used. It is added here that the non-scattered light reflected by the specular surface portion of the mask 1 or the wafer 2 is imaged in the central portion on the partial light blocking plate 31a, where it is blocked thereby and does not reach the photoelectric transducer 33a.

Figure 4:
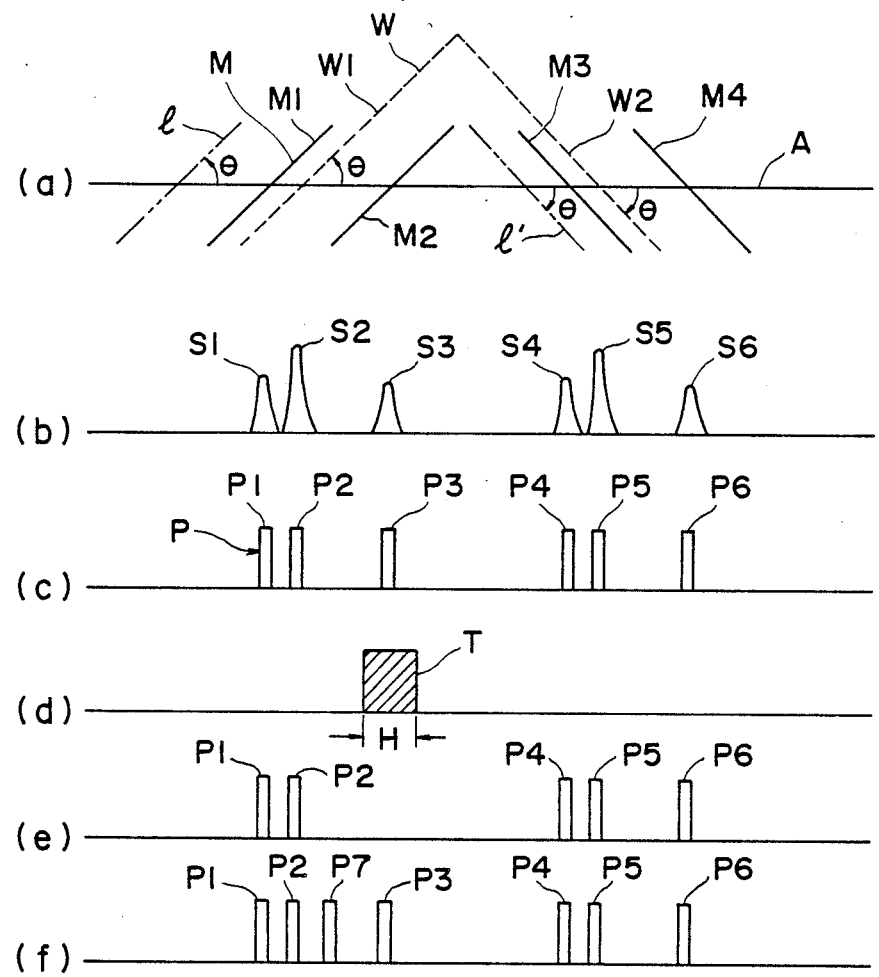
FIG. 4 is a schematic view showing alignment marks and the manner of detecting the same, according to the embodiment of the present invention as illustrated in FIG. 2.

The output signals S1, S2 and S3 of the photoelectric transducer 33a are transmitted to the wave shaping circuit 41, where it is reformed into rectangular pulses P1, P2 and P3 as shown in FIG. 4 (c), having the pulse widths corresponding to widths of the pulses S1, S2 and S3, respectively sliced at a predetermined level. Those rectangular pulse signals P1, P2 and P3 are transmitted to the counter circuit 42 and the processing circuit 44. The counter circuit 42 produces a signal to the control circuit 45 when a predetermined number of pulses (three in this embodiment) is counted. The timer circuit 43 produces a signal T having the time width H at a predetermined point of time as shown in FIG. 4(d) and transmits the same to the control circuit 45. When the control circuit 45 confirms that the third pulse P3 is produced within the time width H, it generates an inclination switching signal to the driver circuit 46 to apply the half wavelength voltage to the PLZT 11. By this, the PLZT 11 rotates the plane of polarization of the P-polarized beam from the laser source 10 by 90 degrees so as to change it to an S-polarized beam. Then, the polarization beam splitter 12 now reflects the S-polarized beam to switch the optical path, so that the beam is reflected by the reflection mirror 18 and is transmitted through the second cylindrical lens 19. Since the second cylindrical lens 19 is inclined with respect to the first cylindrical lens 14 at a proper angle, the inclination of the slit-like illumination area on the mask 1 or wafer 2 is switched so that it extends parallel to the alignment marks M3, W2 and M4 as shown by the reference L' of FIG. 4(a).

The alignment marks M3, W2 and M4 are scanned by the slit-like illumination area l'. The photoelectric transducer 33a produces output signals S4, S5 and S6 as shown in FIG. 4(b), which are reformed into the rectangular pulses P4, P5 and P6 as shown in FIG. 4(c) by the wave shaping circuit 41. In this manner, the detection of the first alignment mark group is accomplished. Those pulses P4, P5 and P6 are processed together with the already detected pulses P1, P2 and P3 at the time when it is necessary.

When, for example, the third pulse P3 is not detected, that is, when the alignment mark M2 is not detected, although the output T is transmitted, the control circuit 45 produces a signal to the drive circuit 46 after the time period H, which is the point of time until which the third pulse P3 is supposed to be detected at the latest. In response thereto, the inclination of the slit-like illumination area is switched, and the detecting operations are effected in the similar manner described above. However, since the pulse P3 is omitted in this case, the pulses transmitted from the wave shaping circuit 41 to the processing circuit 44 are as shown in FIG. 4(e).

The laser beam L is further deflected by the polygonal mirror 17 and reaches the other side surface 23b of the prism 23. Then, the beam L is transmitted through the intermediate lens 25b, the aperture stop 26b and the objective lens 27b so as to be incident on the mask 1 and the wafer 2 to detect the second alignment mark groups thereon in the similar manner as described above.

When the mark positions are searched prior to the above-described alignment mark detecting operations, the scanning operation is effected by the illumination area of only one of the beams, for example, the beam L1.

The above-described signal detecting process is to be executed after the mask 1 and the wafer 2 have been pre-aligned beforehand.

In the above-described description, the present invention is embodied in the apparatus of proximity type, but the present invention is very conveniently applicable to a projection type aligner.

In the following, description of the embodiments, a projection type will be discussed with respect to the projection type apparatus.

Figure 5:
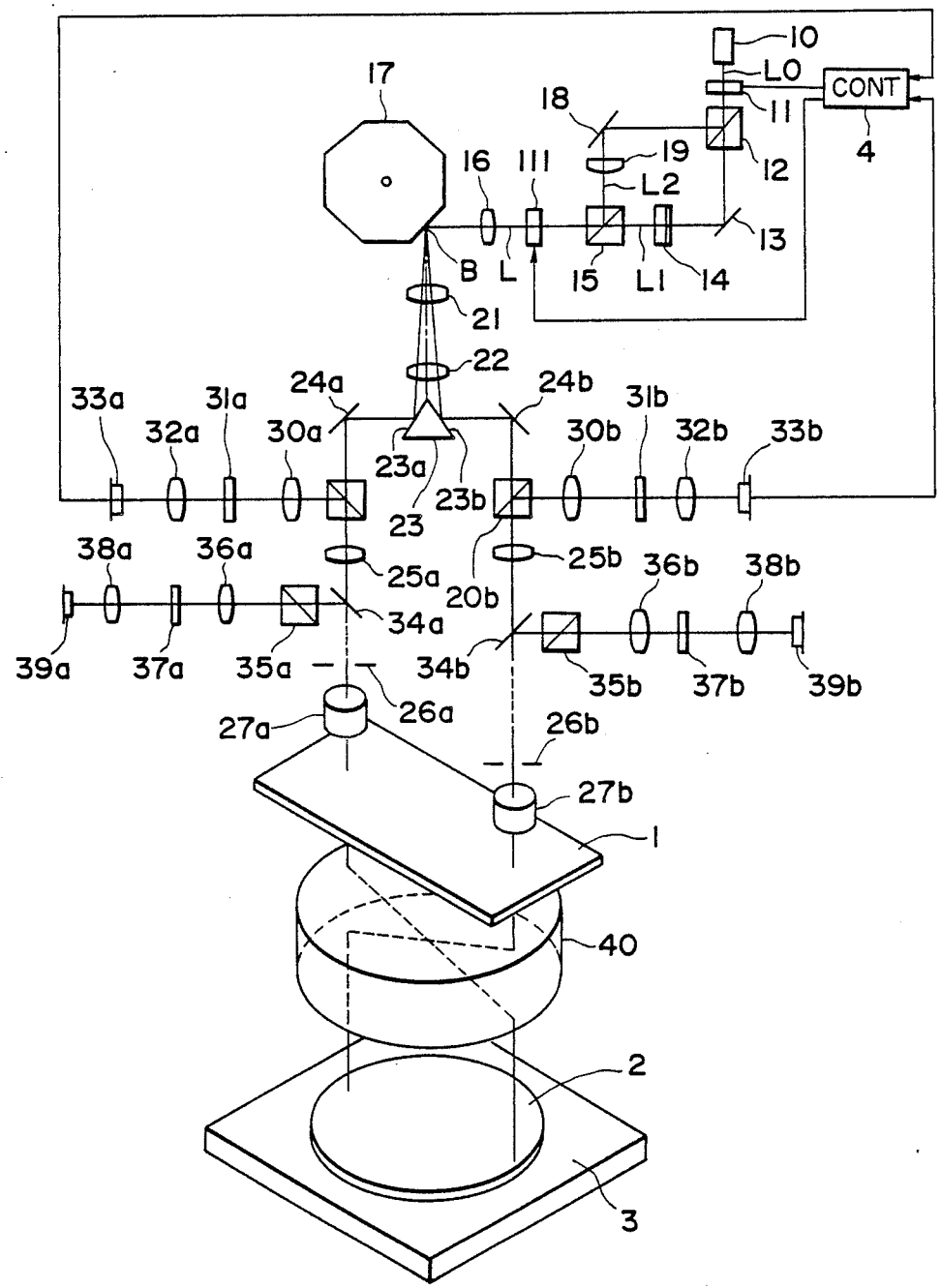
FIG. 5 is a schematic and diagrammatic view showing an optical arrangement of an alignment signal detecting device according to another embodiment of the present invention, which embodiment is effectively applicable to an alignment signal detecting device in an exposure apparatus of projection exposure type.

Referring to FIG. 5, there is shown an optical arrangement of an alignment signal detecting apparatus according to another embodiment of the present invention, wherein like parts are represented by like reference numerals, and designated by reference numerals 1 and 2 are a mask (or reticle) and a wafer, respectively. The wafer 2 is carried on a wafer stage 3. A projection lens system 40 has therein a quarter wave plate. On the mask 1 and the wafer 2, alignment marks M (M1, M2, M3 and M4) and W (W1 and W2) as shown in FIG. 1(a) and FIG. 1(b) are formed. Those marks are physically or optically superimposed as shown in FIG. 1(c) when the mark M is projected on the wafer 2 through the projection lens or when the mark W is projected back on the mask 1 therethrough. The apparatus of FIG. 5 includes a control system 4 for controlling operation of the entire apparatus in accordance with a predetermined sequence.

The apparatus comprises a laser source 10 which produces a predeterminedly polarized beam, for example, a P-polarized beam having a polarization plane which is parallel to the surface of the drawing, and includes a first polarization plane rotating element 11 for rotating the direction of polarization of the beam incident thereon in accordance with a voltage applied thereto. The polarization plane rotating element 11 emits the laser beam as it is (P-polarization) when no voltage is applied from the control system 4. When, however, a predetermined voltage is applied from the control system 4 to the element 11, the element 11 rotates the polarization plane by 90 degrees so as to emit an S-polarized beam having a polarization plane which is perpendicular to the surface of the drawing. In other words, the polarization plane rotating element 11 functions as a halfwave plate when a predetermined voltage (which will be called hereinafter "a halfwave length voltage") is applied. As an example of this element 11, this is an electro-optic ceramic (PLZT) available from MOTOROLA, U.S.A. as No. 9065 for shutters. This element is used in the same manner as in the foregoing embodiment.

Along the optical path of the P-polarized beam emitted from the polarization plane rotating element (which will be hereinafter called simply "PLZT") 11, there are a first polarization beam splitter 12 for selectively deflecting the beam to one of the two optical paths by transmitting a P-polarized beam and reflecting an S-polarized beam, a reflection mirror 13 constituting a part of an optical path for the P-polarized beam transmitted through the first polarization beam splitter 12, a first cylindrical lens 14 for producing a flat beam, a reflecting mirror 18 for constituting an optical path for an S-polarized beam reflected by the polarization beam splitter 12, a second cylindrical lens 19, a second beam splitter 15 for deflecting the P-polarized or S-polarized beam coming from either one of the optical paths by transmitting the P-polarized beam and reflecting the S-polarized beam, a second electric polarization plane rotating element (PLZT) 111, an imaging lens 16 and a rotational polygonal mirror 17. The second PLZT 111 is controlled in synchronism with the PLZT 111 and serves to provide an emergent beam which is polarized in the same direction irrespective of the direction of polarization of the incident beam. The PLZT 111 may be the same element as the PLZT 111. The power axes of the cylindrical lenses 14 and 19 are inclined at 45 degrees with respect to the surface of the drawing and are 90 degrees with respect to each other.

Along the optical path of the beam scanningly deflected by the polygonal mirror 17, there are arranged a so-called f-θ lens 21, a field lens 22 and a prism 23 for deflecting the laser beam L oppositely perpendicularly in accordance with the scanning angle. The optical system downstream of the prism 23 is symmetrical, and each includes a half mirror 24a (24b) for deflecting the laser beam L, a polarization beam splitter 20a (20b) for directing the returning light to a photoelectric detecting system, an intermediate lens 25a (25b), an aperture stop 26a (26b) and an objective lens 27a (27b).

The returning beams are deflected by the respective half mirrors 20a and 20b. Along the optical path for each of the beams transmitted through the half mirror 20a or 20b, there are symmetrically arranged imaging lenses 30a and 30b, partial light blocking members 31a and 31b each having a light blocking portion only adjacent the center thereof, condenser lenses 32a and 32b and photoelectric transducers 33a and 33b. Thus, the two symmetrical photoelectric detection systems are established.

The control system 4 controls the inclination of the illumination area provided by the flat laser beam L on the surface to be scanned on the basis of output signals produced by the photoelectric transducers 33a and 33b.

Figure 6:
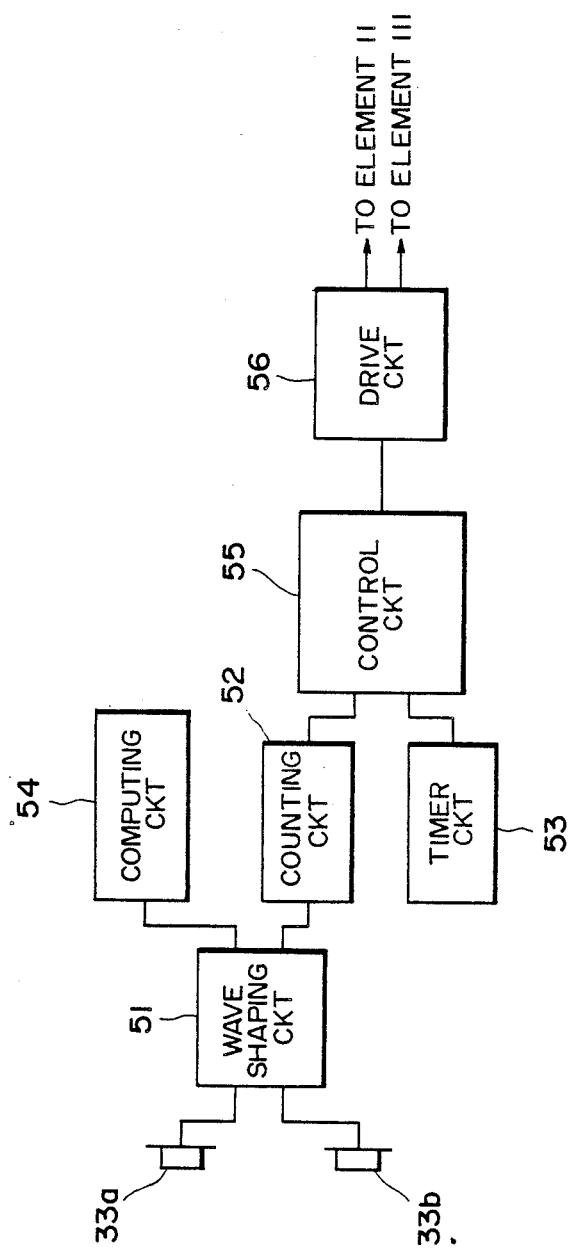
FIG. 6 is a block diagram of a control system employed in the device of FIG. 5.

FIG. 6 is a block diagram of the control system 4 which includes a waveform shaping circuit 51, a counter circuit 52, a timer circuit 53, a processing circuit 54, a control circuit 55 and a driving circuit 56. The output signals from the photoelectric transducers 33a and 33b are transmitted to the control circuit 55 through the waveform shaping circuit 51 and the counter circuit 52. To the control circuit 55, the timer circuit 53 is also connected. The control circuit 55 is connected to the polarization plane rotating elements 11 and 111 through a driving circuit 56. To the processing circuit 54, pulse signals produced by the waveform shaping circuit 51 is introduced, and the state of alignment or misalignment is determined by the computing or processing circuit 54.

In operation, when the voltage is not applied to the PLZT 11 or the PLZT 111, the P-polarized light L0 produced by the laser source 10 is emitted from the PLZT 11 which does not rotate the polarization plane, so that the beam is still P-polarized. The beam L0 is transmitted through the polarization beam splitter 12; is deflected leftwardly by the reflection mirror 13; is reformed into a flat beam L1 having an elongate cross-section (slit-like) by the first cylindrical lens 14; is transmitted through the second polarization beam splitter 15; and is incident on the origin B of deflection of the rotatable polygonal mirror 17 through the PLZT 111 and the imaging lens 16.

When, on the other hand, the voltage is applied to the PLZT 11 and PLZT 111, the P-polarized beam L0 produced by the laser source 10 is converted to an S-polarized beam by the polarization rotation operation of the PLZT 11 which rotates the polarization plane by 90 degrees. Therefore, the beam is then reflected by the polarizationn beam splitter 12 and is deflected by the deflection mirror 18 downwardly as seen in FIG. 2. The S-polarized laser beam reflected by the reflecting mirror 18 is reformed by the second cylindrical lens 17 into a flat beam having an elongated cross-section (slit-like) extending in the direction perpendicular to that of the beam L1. The thus produced flat beam L2 is incident on the second polarization beam splitter 15, where it is directed by reflection in the same direction as the beam L1 and along the same optical path as the beam L1 so that it is incident on the original B of deflection of the polygonal mirror 17. Before reaching the origin B, it passes through the PLZT 111 which is supplied by the voltage. The PLZT 111 rotates the polarization plane to convert the beam to a P-polarized beam.

The laser beam L1 scanningly deflected by the polygonal mirror 17 passes through the intermediate lenses 21 and 22, and thereafter is incident on one side surface 23a of the prism 23, by which it is deflected leftwardly to the half mirror 24a and is deflected downwardly thereby. All of the light is passed through the polarization beam splitter 20, the intermediate lens 25a, the aperture stop 26a and the objective lens 27a and is imaged on the mask 1, and it is also imaged on the wafer 2 through the projection lens 40. The beam incident on the mask 1 is a linearly polarized beam, while the beam incident on the wafer 2 is a circularly polarized beam since it has passed through the quarter wave plate in the projection lens system 40.

The beam imaged on the mask 1 or the wafer 2 forms an illumination area l which is elongate (slit-like) extending parallel to the alignment marks M1, W1 and M2 as shown in FIG. 4(a). The alignment marks M1, W1 and M2 are, therefore, illuminated by the respective illumination areas extending in such a direction.

When the illumination area l scans rightwardly along the scanning line A, the illumination light is reflected by the alignment marks M1, W1 and M2, and the photoelectric transducer 33a is responsive to the scattered light to produce the output signals S1, S2 and S3, as shown in FIG. 4(b). In this case, the output signals S2 are produced by the S-polarized beam, which is converted from the circularly polarized light scattered by the mark W1, passing through the quarter wave plate in the projection lens system 40, and which is returned through the objective lens 27, the aperture stop 26a and the intermediate lens 25a, and then reflected by the polarization beam splitter 20 and then transmitted through the imaging lens 30a, the partial light blocking plate 31a and the condenser lens 32a so as to be incident on the photoelectric transducer 33a. On the other hand, the output signals S1 and S2 are produced in response to the linearly polarized light scattered and diffracted by the respective alignment marks M1 and M2 and are transmitted through the projection lens 40 (FIG. 5) to be converted to a circularly polarized beam, and then imaged on the surface of the wafer 2, and thereafter reflected by the wafer 2 and are returned in the same manner as with the light scattered by the mark W1. The light scattered by the alignment marks M1 and M2 on the mask 1 contains, in addition to the scattered and diffracted light, a component of directly reflected light MD which directly returns to the objective lens 27a. However, the directly reflected light MD has the same state of polarization as before the reflection, and therefore, it is transmitted through the polarization beam splitter 20 with the result that it does not impinge on the photoelectric transducer 33a.

Since the illumination area l substantially overlaps along the alignment marks M1, W1 and M2, the accuracy of detection is improved as compared with the case of a spot beam. The light transmitted through the flat surface of the mask 1 and then reflected nonscatteredly by the specular surface of the wafer 2 is imaged on the central part of the partial light blocking plate 31a, so that it does not reach the photo electric transducer 33a.

The output signals S1, S2 and S3 of the photoelectric transducer 33a are transmitted to the wave shaping circuit 51, where it is reformed into rectangular pulses P1, P2 and P3 as shown in FIG. 4 (c), having the pulse widths corresponding to widths of the pulses S1, S2 and S3, respectively sliced at a predetermined level. Those rectangular pulse signals P1, P2 and P3 are transmitted to the counter circuit 52 and the processing circuit 54. The counter circuit 52 produces a signal to the control circuit 55 when a predetermined number of pulses (three in this embodiment) is counted. The timer circuit 53 produces a signal T having the time width H at a predetermined point of time as shown in FIG. 4(d) and transmits the same to the control circuit 55. When the control circuit 55 confirms that the third pulse P3 is produced within the time width H, it generates an inclination switching signal to the driver circuit 56 to apply the half wavelength voltage to the PLZT 11. By this, the PLZT 11 rotates the plane of polarization of the P-polarized beam from the laser source 10 by 90 degrees so as to change it to an S-polarized beam. Then, the polarization beam splitter 12 reflects the S-polarized beam to switch the optical path, so that the beam is reflected by the reflection mirror 18 and is transmitted through the second cylindrical lens 19. Since the second cylindrical lens 19 is inclined with respect to the first cylindrical lens 14 at a proper angle, the inclination of the slit-like illumination area on the mask 1 or wafer 2 is switched so that it extends parallel to the alignment marks M3 W2 and M4 as shown by the reference l' of FIG. 4 (a). At this time, a halfwave voltage is applied to the PLZT 111, so that the S-polarized beam passed through the second cylindrical lens 16 is converted to a P-polarized beam by the PLZT 111. Thus, the direction of plane of polarization is constant.

The alignment marks M3, W2 and M4 are scanned by the slit-like illumination area l'. The photoelectric transducer 33a produces output signals S4, S5 and S6 as shown in FIG. 4(b), which are reformed into the rectangular pulses P4, P5 and P6 as shown in FIG. 4(c) by the wave shaping circuit 51. In this manner, the detection of the first alignment mark group is accomplished. Those pulses P4, P5 and P6 are processed together with the already detected pulses P1, P2 and P3 at the time when it is necessary.

When, for example, the third pulse P3 is not detected, that is, when the alignment mark M2 is not detected, although the output T is transmitted, the control circuit 55 produces a signal to the drive circuit 56 after the time period H, which is the point of time until which the third pulse P3 is supposed to be detected at the latest. In response thereto, the inclination of the slit-like illumination area is switched, and the detecting operations are effected in the similar manner described above. However, since the pulse P3 is omitted in this case, the pulses transmitted from the wave shaping circuit 51 to the processing circuit 54 are as shown in FIG. 4(e).

The laser beam L is further deflected by the polygonal mirror 17 and reaches the other side surface 23b of the prism 23. Then, the beam L is transmitted through the reflecting mirror 24b, the polarization beam splitter 20b, the intermediate lens 25b, the aperture stop 26b and the objective lens 27b so as to be incident on the mask 1 and the wafer 2 to detect the second alignment mark groups thereon in the similar manner as described above.

When the mark positions are searched prior to the above-described alignment mark detecting operations, the scanning operation is effected by the illumination area of only one of the beams, for example, the beam L1.

The alinment signal detecting device of the above described two embodiments have the following advantages.

1. Since the illumination beam has an elongate cross-section extending substantially co-directionally with respect to the mark inclinations, the devices are not easily influenced by the light scattered by foreign matter such as dust.

2. Since the inclination of the cross-section of the scanning beam is switched during one scan so as to match each of the marks, one scan is sufficient to deal with one group of marks. This leads to a high speed detecting operation.

3. By switching the direction of polarization with the use of a polarization plane rotating element, the beam can be selectively introduced into two paths with the use of the polarization beam splitter. Therefore, the efficiency of a usable amount of light when producing the light inclined in the desired direction or when introducing the light to be detected to the detecting optical system, is not less than 90 % when one polarization plane rotating element is used, and not less than 81 % when two are used, assuming reasonably that the transmittance of the element is not less than 90 % neglecting the reflection rate and the transmittance of the polarization beam splitter, which are very small. Those figures are even higher than conventional which are not more than 50 %.

4. As compared with one of the conventional systems wherein a cross beam is used, the detector for detecting the light scattered by the marks is not required to detect the directions of mark inclinations so that the structure of the detector is simplified.

This embodiment employs a reduction projection optical system. However, this invention is applicable to another type such as a mirror projection system of a unit magnification type. Also, this invention is applicable not only to the proximity system, but also to a contact system. In this case, a quarter wave length plate is disposed between the mask 1 and the objective lens 27a (27b), so that the laser beam can be separated out substantially without loss by the polarization beam splitters 20a and 20b in the on-coming and out-going paths. Because of this, the efficiency of utilization of the laser beam is increased. This increase is made in addition to the increase provided by the fact that the beam for each of the inclinations is obtained in the time-sharing manner. Additionally, the possible returning of the beam reflected by the alignment marks can be made substantially zero.

In the foregoing embodiment, the signals S1 and S3 produced from the beam diffracted by the alignment marks M1 and M3 on the mask 1 are also detected on the basis of the light MW reflected by the wafer 2. However, the S/N ratio is better when the light MD reflected by the mask 1 is directly used for producing the signals S1 and S3. This light MD can be detected without decreasing the efficiency of utilization of the laser output, because of the arrangement shown in FIG. 5 including half mirrors 34a and 34b having a low index of reflection, polarization beam splitters 35a and 35b, imaging lenses 36a and 36b, partial light blocking plates 37a and 37b, condenser lenses 38a and 38b and photoelectric transducers 39a and 39b.

The present invention is applicable not only to an exposure apparatus such as a mask aligner, but also to other alignment devices in the field of printing, for example.

In the foregoing embodiments, the polarization plane rotating element uses an electro-optic crystal such as the PLZT, but it is possible to use an element using a magneto-optic effect or the like. It will suffice if the polarization plane rotating element is electrically controlable; it can be switched at a speed of response higher than the scanning speed by the laser beam; and it can provide at least two states of polarization.

The alignment mark used with the foregoing embodiments is as shown in FIG. 1, but the alignment mark can have other shapes and arrangements, and the present invention is applicable to the other types.

In this embodiment, the inclination of the illumination area is changed by selectively passing the laser beam on one of two optical paths having the lenses different in the direction of power or having slits having different shapes of apertures. By changing the directions of the power, it can meet various alignment marks. For example, the cylindrical lenses may be driven so as to be rotated about their optical axes, whereby the device can be used with a wider variety of apparatus.

The sequential controller for switching the inclination of the illumination area may be in the form of structure other than described above.

Figure 7:
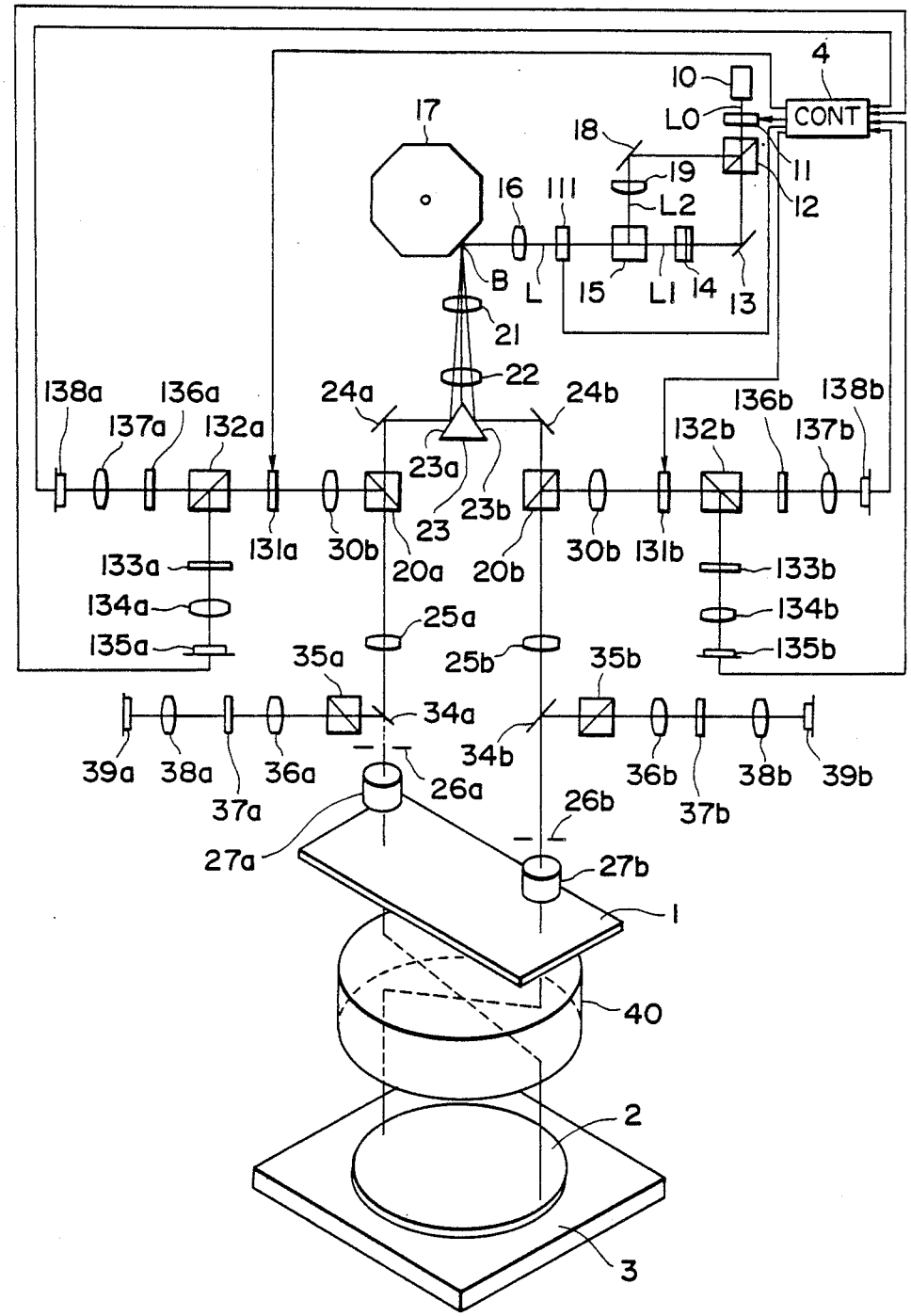
FIG. 7 is a schematic and diagrammatic view showing an optical arrangement of an alignment signal detecting device according to a third embodiment of the present invention.

Referring to FIG. 7, there is shown an optical arrangement of an alignment signal detecting apparatus according to another embodiment of the present invention, wherein like parts are represented by like reference numerals and designated by reference numerals 1 and 2 are a mask (or reticle) and a wafer, respectively. The wafer 2 is carried on a wafer stage 3. A projection lens system 40 has therein a quarter wave plate. On the mask 1 and the wafer 2, alignment marks M (M1, M2, M3 and M4) and W (W1 and W2) as shown in FIG. 1(a) and FIG. 1(b) are formed. Those marks are physically or optically superimposed as shown in FIG. 1(c) when the mark M is projected on the wafer 2 through the projection lens or when the mark W is projected back on the mask 1 therethrough. The apparatus of FIG. 7 includes a control system 4 for controlling operation of the entire apparatus in accordance with a predetermined sequence.

The apparatus comprises a laser source 10 which produces a predeterminedly polarized beam, for example, a P-polarized beam having a polarization plane which is parallel to the surface of the drawing, and includes a first polarization plane rotating element 11 for rotating the direction of polarization of the beam incident thereon in accordance with a voltage applied thereto. The polarization plane rotating element 11 emits the laser beam as it is (P-polarization) when no voltage is applied from the control system 4. When, however, a predetermined voltage is applied from the control system 4 to the element 11, the element 11 rotates the polarization plane by 90 degrees so as to emit an S-polarized beam having a polarization plane which is perpendicular to the surface of the drawing. In other words, the polarization plane rotating element 11 functions as a halfwave plate when a predetermined voltage (which will be called hereinafter "a halfwave length voltage") is applied. As an example of this element 11, this is an electro-optic ceramic (PLZT) available from MOTOROLA, U.S.A. as No. 9065 for shutters. This element is used in the same manner as in the foregoing embodiments.

Along the optical path of the P-polarized beam emitted from the polarization plane rotating element (which will be hereinafter called simply "PLZT") 11, there are a first polarization beam splitter 12 for selectively deflecting the beam to one of the two optical paths by transmitting a P-polarized beam and reflecting an S-polarized beam, a reflection mirror 13 constituting a part of an optical path for the P-polarized beam transmitted through the first polarization beam splitter 12, a first cylindrical lens 14 for producing a flat beam, a reflecting mirror 18 for constituting an optical path for an S-polarized beam reflected by the polarization beam splitter 12, a second cylindrical lens 19, a second beam splitter 15 for deflecting the P-polarized or S-polarized beam coming from either one of the optical paths by transmitting the P-polarized beam and reflecting the S-polarized beam, a second polarization plane rotating element (PLZT) 111, an imaging lens 16 and a rotational polygonal mirror 17. The second PLZT 111 is controlled in synchronism with the PLZT 111 and serves to provide an emergent beam which is polarized in the same direction irrespective of the direction of polarization of the incident beam. The PLZT 111 may be the same element as the PLZT 111. The power axes of the cylindrical lenses 14 and 19 are inclined at 45 degrees with respect to the surface of the drawing and are 90 degrees with respect to each other. Along the optical path of the beam scanningly deflected by the polygonal mirror 19, there are arranged a so-called f-θ lens 21, a field lens 22 and a prism 23 for deflecting the laser beam L oppositely perpendicularly in accordance with the scanning angle. The optical system downstream of the prism 23 is symmetrical, and each includes a half mirror 24a (24b) for deflecting the laser beam L, a polarization beam splitter 20a (20b) for directing the returning light to a photoelectric detecting system, an intermediate lens 25a (25b), an aperture stop 26a (26b) and an objective lens 27a (27b). The returning beams are deflected by the respective half mirrors 24a and 24b. Along the optical path for each of the beams reflected by the half mirror 20a or 20b, there are symmetrically arranged imaging lenses 30a and 30b, PLZT 131a, PLZT 131b which are similar to the PLZT 111 and beam splitters 132a and 132b for separating the P-polarized beam and the S-polarized beam. Along the optical path for the P-polarized beam separated by the polarization beam splitters 132a and 132b, there are symmetrically arranged stoppers 133a and 133b shown in FIG. 9 having the transparent portions 71a and 71c, condenser lenses 134a and 134b, photoelectric transducers 135a and 135b. Along the path for the S-polarized beam, there are similarly stoppers 136a and 136b shown in FIG. 9 having the transparent portions 71b and 71d, condenser lenses 137a and 137b, photoelectric transducers 138a and 138b. Thus, the two symmetrical photoelectric detection systems are established.

The control system 4 controls the inclination of the illumination area provided by the flat laser beam L on the surface to be scanned on the basis of output signals produced by the photoelectric transducers 135a, 135b, 138a and 138b.

FIG. 8 is a block diagram of the control system 4 which includes a waveform shaping circuit 61, a counter circuit 62, a timer circuit 63, a processing circuit 64, a control circuit 65 and a driving circuit 66. The output signals from the photoelectric transducers 135a, 135b, 138a and 138b are transmitted to the control circuit 65 through the waveform shaping circuit 61 and the counter circuit 62. To the control circuit 65, the timer circuit 63 is also connected. The control circuit 65 is connected to the polarization plane rotating element 11, through a driving circuit 66. To the processing circuit 64, pulse signals produced by the waveform shaping circuit 61 is introduced, and the state of alignment or misalignment is determined by the computing or processing circuit 64.

In operation, when the voltage is not applied to the PLZT 11, the PLZT 111, the PLZT 131a or the PLZT 131b, the P-polarized light L0 produced by the laser source 10 is emitted from the PLZT 11 which does not rotate the polarization plane, so that the beam is still P-polarized. The beam L0 is transmitted through the polarization beam splitter 12; is deflected leftwardly by the reflection mirror 13; is reformed into a flat beam L1 having an elongate cross-section (slit-like) by the first cylindrical lens 14; is transmitted through the second polarization beam splitter 15; and is incident on the origin B of deflection of the rotatable polygonal mirror 17 through the PLZT 111 and the imaging lens 16.

When, on the other hand, the voltage is applied to the PLZT 11, PLZT 111, the PLZT 131a and PLZT 131b, the P-polarized beam L0 produced by the laser source 10 is converted to an S-polarized beam by the polarization rotation operation of the PLZT 11 which rotates the polarization plane by 90 degrees. Therefore, the beam is then reflected by the polarization beam splitter 12 and is deflected by the deflection mirror 18 downwardly as seen in FIG. 2. The S-polarized laser beam reflected by the reflecting mirror 18 is reformed by the second cylindrical lens 17 into a flat beam having an elongated cross-section (slit-like) extending in the direction perpendicular to that of the beam L1. The thus produced flat beam L2 is incident on the second polarization beam splitter 15, where it is directed by reflection in the same direction as the beam L1 and along the same optical path as the beam L1 so that it is incident on the original B of deflection of the polygonal mirror 17. Before reaching the origin B, it passes through the PLZT 111 which is supplied by the voltage. The PLZT 111 rotates the polarization plane to convert the beam to a P-polarized beam.

The laser beam L1 scanningly deflected by the polygonal mirror 17, when no voltage is applied to the PLZT 11, 111, 131a and 131b, passes through the lenses 21 and 22, and thereafter, is incident on one side surface 23a of the prism 23, by which it is deflected leftwardly to the half mirror 24a and is deflected downwardly thereby. All of the light is passed through the polarization beam splitter 20, the intermediate lens 25a, the aperture stop 26a and the objective lens 27a and is re-imaged on the mask 1, and it is also imaged on the wafer 2 through the projection lens 40. The beam incident on the mask 1 is a linearly polarized beam (P-polarized), while the beam incident on the wafer 2 is a circularly polarized beam since it has passed through the quarter wave plate in the projection lens system 40.

The beam imaged on the mask 1 or the wafer 2 forms an illumination area 1 which is elongate (slit-like) extending parallel to the alignment marks M1, W1 and M2 as shown in FIG. 4(a). The alignment marks M1, W1 and M2 are, therefore, illuminated by the respective illumination areas extending in such a direction.

When the illumination area 1 scans rightwardly along the scanning line A, the illumination light is reflected by the alignment marks M1, W1 and M2, and the photoelectric transducer 33a is responsive to the scattered light to produce the output signals S1, S2 and S3, as shown in FIG. 4(b). In this case, the output signals S2 are produced by the linearly polarized (S-polarized) beam, scattered by the mark W1, passing through the quarter wave plate in the projection lens system 40, and which is returned through the objective lens 27, the aperture stop 26a and the intermediate lens 25a, and then reflected by the polarization beam splitter 20 and then transmitted through the imaging lens 30a, and the PLZT 131a, and then reflected by the polarization beam splitter and thereafter passed through the stopper 131a and the condenser lens 134a so as to be incident on the photoelectric transducer 135a. On the other hand, the output signals S1 and S2 are produced in response to the linearly polarized light scattered and diffracted by the respective alignment marks M1 and M2 and are transmitted through the projection lens 40 (FIG. 7) to be converted to a circularly polarized beam, and then imaged on the surface of the wafer 2, and thereafter reflected by the wafer 2 and are returned in the same manner as with the light scattered by the mark W1. The light scattered by the alignment marks M1 and M2 on the mask 1 contains, in addition to the scattered and diffracted light, a component of directly reflected light MD which directly returns to the objective lens 27a. However, the directly reflected light MD has the same state of polarization as before the reflection, and therefore, it is transmitted through the polarization beam splitter 20 with the result that it does not impinge on the photoelectric transducer 33a.

Since the illumination area 1 substantially overlaps along the alignment marks M1, W1 and M2, the accuracy of detection is improved as compared with the case of a spot beam. The light transmitted through the flat surface of the mask 1 and then reflected non-scatteredly by the specular surface of the wafer 2 is imaged on the central part of the partial light blocking plate 133a, so that it does not reach the photoelectric transducer 135a.

The output signals S1, S2 and S3 of the photoelectric transducer 135a are transmitted to the wave shaping circuit 61, where it is reformed into rectangular pulses P1, P2 and P3 as shown in FIG. 4 (c), having the pulse widths corresponding to widths of the pulses S1, S2 and S3, respectively sliced at a predetermined level. Those rectangular pulse signals P1, P2 and P3 are transmitted to the counter circuit 62 and the processing circuit 64. The counter circuit 62 produces a signal to the control circuit 65 when a predetermined number of pulses (three in this embodiment) is counted. The timer circuit 63 produces a signal T having the time width H at a predetermined point of time as shown in FIG. 4(d) and transmits the same to the control circuit 65. When the control circuit 65 confirms that the third pulse P3 is produced within the time width H, it generates an inclination switching signal to the driver circuit 66 to apply the half wavelength voltage to the PLZT 11, 131a and 131b. By this, the PLZT 11 rotates the plane of polarization of the P-polarized beam from the laser source 10 by 90 degrees so as to change it to an S-polarized beam. Then, the polarization beam splitter 12 reflects the S-polarized beam to switch the optical path, so that the beam is reflected by the reflection mirror 18 and is transmitted through the second cylindrical lens 19. Since the second cylindrical lens 19 is inclined with respect to the first cylindrical lens 14 at a proper angle, the inclination of the slit-like illumination area on the mask 1 or wafer 2 is switched so that it extends parallel to the alignment marks M3, W2 and M4 as shown by the reference 1' of FIG. 4(a). At this time, a halfwave voltage is applied to the PLZT 111, so that the S-polarized beam passed through the second cylindrical lens 16 is converted to a P-polarized beam by the PLZT 111. Thus, the direction of plane of polarization is constant.

The alignment marks M3, W2 and M4 are scanned by the slit-like illumination area 1'. The light reflected by the wafer 2, similarly to the described above, returns through the projection lens 40 and the imaging lens 30a and is incident on the PLZT 131a, which is now supplied by the voltage, so that it is converted to a P-polarized beam. Therefore, the reflected light is transmitted through the polarization beam splitter 132a and reaches the photoelectric transducer 138a by way of the stopper 136a and the condenser lens 137a. By this, photoelectric transducer 138a produces output signals S4, S5 and S6 as shown in FIG. 4(b), which are reformed into the rectangular pulses P4, P5 and P6 as shown in FIG. 4(c) by the wave shaping circuit 61. In this manner, the detection of the first alignment mark group is accomplished. Those pulses P4, P5 and P6 are processed together with the already detected pulses P1, P2 and P3 at the time when it is necessary.

When, for example, the third pulse P3 is not detected, that is, when the alignment mark M2 is not detected, although the output T is transmitted, the control circuit 65 produces a signal to the drive circuit 66 after the time period H, which is the point of time until which the third pulse P3 is supposed to be detected at the latest. In response thereto, the inclination of the slit-like illumination area is switched, and the detecting operations are effected in the similar manner described above. However, since the pulse P3 is omitted in this case, the pulses transmitted from the wave shaping circuit 61 to the processing circuit 64 are as shown in FIG. 4(e).

The laser beam L is further deflected by the polygonal mirror 17 and reaches the other side surface 23b of the prism 23. Then, the beam L is transmitted through the intermediate lens 25b, the aperture stop 26b and the objective lens 27b so as to be incident on the mask 1 and the wafer 2 to detect the second alignment mark groups thereon in the similar manner as described above.

As described in the foregoing, the scattered light is selectively branched out in response to the inclination of the mark to be detected. In the selected optical path, only the desired component is taken out by the spatial filter. Because of this, the number of the slits of the filter can be reduced, and the accuracy in the dimensions of the parts and the alignment may be relatively non-severe as compared with the conventional case (FIG. 9) in which one component of the scattered light is separated out of all of the scattered light. Additionally, it is not necessary that a photoelectric detector for detecting the scattered light is of such a complicated structure that the light receiving surface is divided as shown in FIG. 10 with a severe precision. Further, when the components of light scattered in plural directions by a single mark are combined in order to increase the S/N ratio in the detection, the respective components are separated by a spatial filter and then they are electrically combined in the conventional apparatus. According to the present invention, they are divided in accordance with the inclination of the alignment mark prior to separating spatially to the respective components, so that the combined output can be obtained directly from the photoelectric detector by a simple structure wherein a proper number of transparent portions are provided in the spatial filter.

This embodiment employs a reduction projection optical system. However, this invention is applicable to another type such as a mirror projection system of a unit magnification type. Also, this invention is applicable to the proximity system and a contact system wherein there is no projection optical system between the mask and the wafer. The scanning beam is not limited to the flat beam, and a spot beam is usable to enjoy the advantages of the present invention.

In the foregoing embodiment, the signals S1 and S3 produced from the beam diffracted by the alignment marks M1 and M3 on the mask 1 are also detected on the basis of the light MW reflected by the wafer 2. However, the S/N ratio is better when the light MD reflected by the mask 1 is directly used for producing the signals S1 and S3. This light MD can be detected without decreasing the efficiency of utilization of the laser output, because of the arrangement shown in FIG. 5 including half mirrors 34a and 34b having a low index of reflection, polarization beam splitters 35a and 35b, imaging lenses 36a and 36b, partial light blocking plates 37a and 37b, condenser lenses 38a and 38b and photoelectric transducers 39a and 39b.

In the foregoing embodiments, the polarization plane rotating elements 131a and 131b for selectively passing the beam through one of the optical paths is an electro-optic crystal such as the PLZT, but it is possible to use an element using a magneto-optic effect or the like. It will suffice if the polarization plane rotating element is electrically controlable; it can be switched at a speed of response higher than the scanning speed by the laser beam; and it can provide at least two states of polarization. The contour of the transparent portion of the spatial filter is determined in accordance with the shape of the alignment mark.

Figure 11:
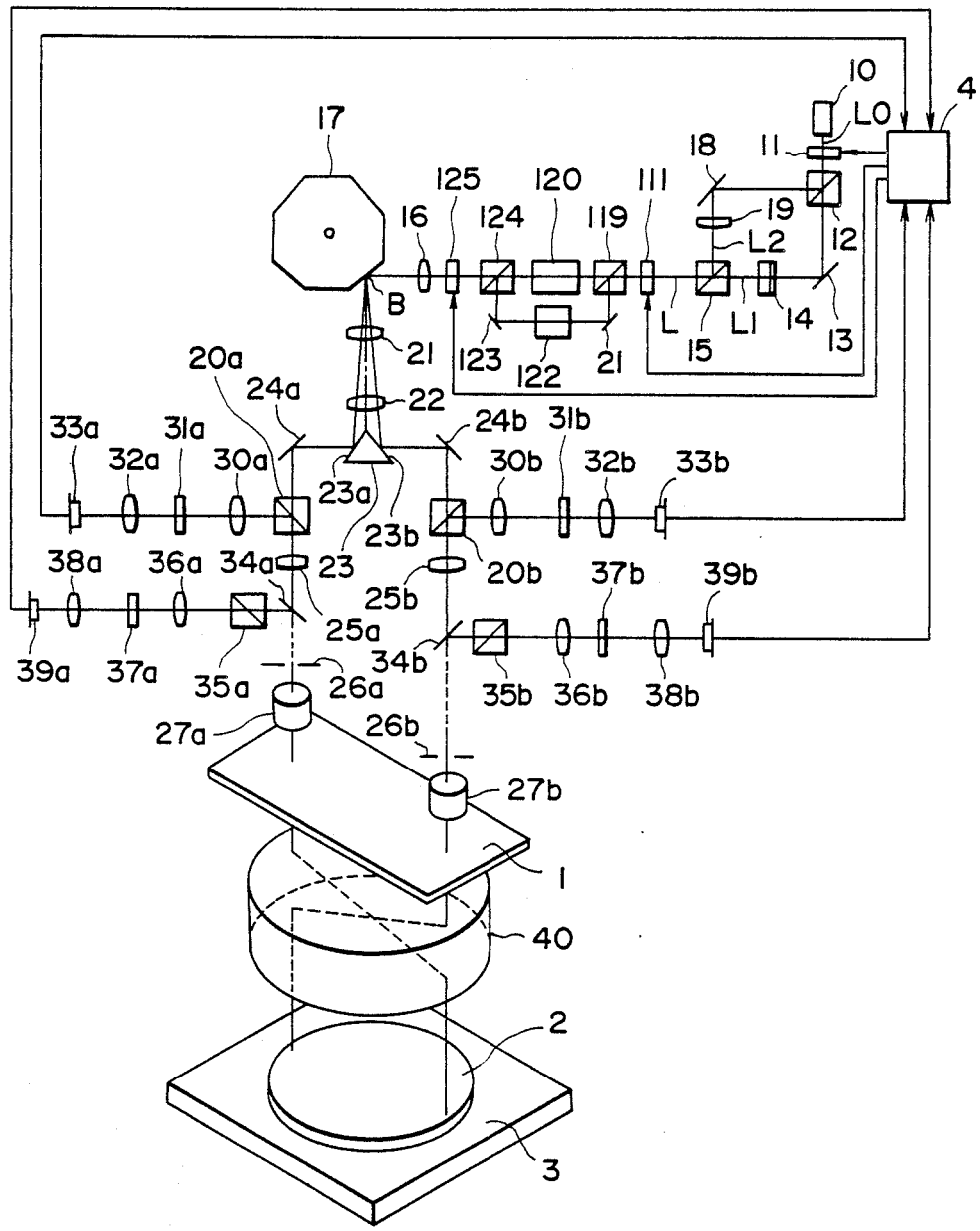
FIG. 11 is a schematic and diagrammatic view showing an optical arrangement of an alignment signal detecting device according to a fourth embodiment of the present invention.

Referring to FIG. 11, there is shown an optical arrangement of an alignment signal detecting apparatus according to another embodiment of the present invention, wherein like parts are represented by like reference numerals and designated by reference numerals 1 and 2 are a mask (or reticle) and a wafer, respectively. The wafer 2 is carried on a wafer stage 3. A projection lens system 40 has therein a quarter wave plate. On the mask 1 and the wafer 2, alignment marks M (M1, M2, M3 and M4) and W (W1 and W2) as shown in FIG. 1(a) and FIG. 1(b) are formed. Those marks are physically or optically superimposed as shown in FIG. 1(c) when the mark M is projected on the wafer 2 through the projection lens or when the mark W is projected back on the mask 1 therethrough. The apparatus of FIG. 2 includes a control system 4 for controlling operation of the entire apparatus in accordance with a predetermined sequence.

The apparatus comprises a laser source 10 which produces a predeterminedly polarized beam, for example, a P-polarized beam having a polarization plane which is parallel to the surface of the drawing, and includes a first polarization plane rotating element 11 for rotating the direction of polarization of the beam incident thereon in accordance with a voltage applied thereto. The polarization plane rotating element 11 emits the laser beam as it is (P-polarization) when no voltage is applied from the control system 4. When, however, a predetermined voltage is applied from the control system 4 to the element 11, the element 11 rotates the polarization plane by 90 degrees so as to emit an S-polarized beam having a polarization plane which is perpendicular to the surface of the drawing. In other words, the polarization plane rotating element 11 functions as a halfwave plate when a predetermined voltage (which will be called hereinafter "a halfwave length voltage") is applied. As an example of this element 11, this is an electro-optic ceramic (PLZT) available from MOTOROLA, U.S.A. as No. 9065 for shutters. This element is used in the same manner as in the foregoing embodiment.

Along the optical path of the P-polarized beam emitted from the first polarization plane rotating element (which will be hereinafter called simply "PLZT") 11, there are a first polarization beam splitter 12 for selectively deflecting the beam to one of the two optical paths by transmitting a P-polarized beam and reflecting an S-polarized beam, a reflection mirror 13 constituting a part of an optical path for the P-polarized beam transmitted through the first polarization beam splitter 12, a first cylindrical lens 14 for producing a flat beam, a reflecting mirror 18 for constituting an optical path for an S-polarized beam reflected by the polarization beam splitter 12, a second cylindrical lens 19 and a second beam splitter 15 for deflecting the P-polarized or S-polarized beam coming from either one of the optical paths by transmitting the P-polarized beam and reflecting the S-polarized beam. The power axes of the cylindrical lenses 14 and 19 are inclined at 45 degrees with respect to the surface of the drawing and are 90 degrees with respect to each other.

The apparatus further comprises along the optical path of a flat laser beam L emergent from the second polarization beam splitter 15, a second PLZT 111 and a third polarization beam splitter 119 which are cooperative with each other in the same manner as of the combination of the first PLZT 11 and the first polarization beam splitter 12 so as to direct the incident beam selectively to one of two optical paths, a condensing lens 120 disposed across the optical path for the flat P-polarized beam transmitted through the polarization beam splitter 119, a reflection mirror 121 for constituting an optical path for the flat S-polarized beam reflected by the polarization beam splitter 119, a condenser lens 122, a reflection mirror 123, a fourth polarization beam splitter 124 which functions in the same manner as the second polarization beam splitter 15 to direct the beam from the two optical paths including the condenser lenses 120 and 122 to the same direction, a third PLZT 125 which is controlled in synchronism with the PLZT 11 and the PLZT 111 to provide the same direction of polarization, an imaging lens 16 and a rotational polygonal mirror 17. The condenser lens 120 is effective to image the beam introduced thereto by the polarization beam splitter 119 on the surface of the mask 1, whereas the condenser lens 122 is effective to image the flat beam L introduced by the polarization beam splitter 119 on the surface of the wafer 2.

Along the optical path of the beam scanningly deflected by the polygonal mirror 17, there are arranged a so-called f-θ lens 21, a field lens 22 and a prism 23 for reflecting the laser beam L oppositely perpendicularly in accordance with the scanning angle. The optical system downstream of the prism 23 is symmetrical, and each includes a half mirror 24a (24b) for deflecting the laser beam L, a polarization beam splitter 20a (20b) for directing the returning light reflected by the wafer 2 to a first photoelectric detecting system, an intermediate lens 25a (25b), half mirrors 34a and 34b having a relatively low reflection rate to introduce the light MD directly reflected by the reticle 1, an aperture stop 26a (26b) and an objective lens 27a (27b).

The returning beams are deflected by the respective half mirrors 34a and 34b. Along the optical path for each of the beams transmitted through the half mirror 34a or 34b, there are symmetrically arranged first photoelectric detecting systems constituted by polarization beam splitters 35a, 35b, imaging lenses 36a and 36b, partial light blocking members 37a and 37b each having a light blocking portion only adjacent the center thereof, condenser lenses 38a and 38b and photoelectric transducers 39a and 39b. Further, along the optical path for the beam reflected by the polarization beam splitters 20a and 20b, there are symmetrically second photoelectric detection systems constituted respectively by imaging lens 30a and 30b, partial light blocking plates 31a and 31b each having a light blocking portion only adjacent the center thereof, condenser lenses 32a and 32b and photoelectric transducers 33a and 33b. Thus, the two symmetrical photoelectric detection systems are established.

The control system 4 controls the imaging position and the inclination of the illumination area provided by the flat laser beam L on the surface to be scanned on the basis of output signals produced by the photoelectric transducers 33a, 33b, 39a and 39b.

Figure 12:
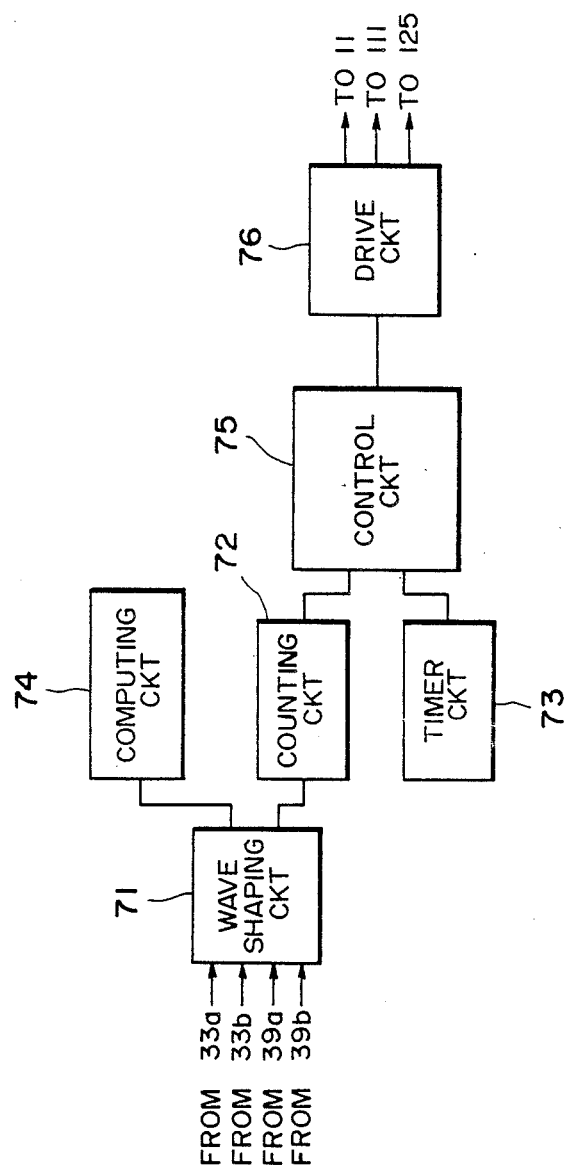
FIG. 12 is a block diagram of a control system employed in the device of FIG. 11.

FIG. 12 is a block diagram of the control system 4 which includes a waveform shaping circuit 71, a counter circuit 72, a timer circuit 73, a processing circuit 74, a control circuit 75 and a driving circuit 76. The output signals from the photoelectric transducers 33a and 33b are transmitted to the control circuit 75 through the waveform shaping circuit 71 and the counter circuit 72. To the control circuit 75, the timer circuit 73 is also connected. The control circuit 75 is connected to the polarization plane rotating element 11 through a driving circuit 76. To the processing circuit 74, pulse signals produced by the waveform shaping circuit 71 is introduced, and the state of alignment or misalignment is determined by the computing or processing circuit 74.

During alignment, the controller 4 controls the voltages applied to the PLZT 111 and PLZT 125 in accordance with Table 1 depending on the inclination of the mark and on whether the mark is on the mask 1 or on the wafer 2. In the Table "Yes" means that the halfwave voltage is applied, and "No" means that it is not applied.

TABLE 1

|    | PLZT 11 | PLZT 111 | PLZT 125 |
|----|---------|----------|----------|
| M1 | No      | No       | No       |
| W1 | No      | Yes      | Yes      |
| M2 | No      | No       | No       |
| M3 | Yes     | Yes      | No       |
| W2 | Yes     | No       | Yes      |
| M4 | Yes     | Yes      | No       |

In operation, when the voltage is not applied to the PLZT 11, the P-polarized light L0 produced by the laser source 10 is emitted from the PLZT 11 which does not rotate the polarization plane, so that the beam is still P-polarized. The beam L0 is transmitted through the first polarization beam splitter 12; is deflected leftwardly by the reflection mirror 13; is reformed into a flat beam L1 (P-polarized) having an elongate cross-section (slit-like) and having an inclination corresponding to the marks M1, W1 and M2 by the first cylindrical lens 14; is transmitted through the second polarization beam splitter 15; and is incident on the second PLZT 111.

When, on the other hand, the halfwave voltage is applied to the PLZT 11 and PLZT 111, the P-polarized beam L0 produced by the laser source 10 is converted to an S-polarized beam by the polarization rotation operation of the PLZT 11 which rotates the polarization plane by 90 degrees. Therefore, the beam is then reflected by the polarization beam splitter 12 and is deflected by the deflection mirror 18 downwardly as seen in FIG. 2. The S-polarized laser beam reflected by the reflecting mirror 18 is reformed by the second cylindrical lens 17 into a flat beam (S-polarized) having an elongated cross-section (slit-like) extending in the direction matching the alignment marks M3, W2 and M4. The thus produced flat beam L2 is incident on the second polarization beam splitter 15, where it is directed by reflection in the same direction as the beam L1 and along the same optical path as the beam L1 so that it is incident on the second PLZT 111.

The second PLZT 111 and the third PLZT 125 are also responsive to the respective voltages applied from the controller 4 to control the direction of polarization of the incident beam. When the flat beam L (L1 or L2) emergent from the PLZT 111 is a P-polarized beam, it is transmitted through the third polarization beam splitter 119 and is directed to the origin B of deflection of the rotational polygonal mirror 17 through the mask condenser lens 120, the fourth polarization beam splitter 124, the PLZT 125 and the imaging lens 16. On the other hand, when it is an S-polarized beam, it is deflected downwardly by the polarization beam splitter 119 and then deflected leftwardly by the reflecting mirror 121 and passed through the wafer condenser lens 122. Further, it is deflected upwardly by the reflecting mirror 123 and is incident on the polarization beam splitter 124, by which it is reflected to the same direction as the P-polarized beam so that it is directed to the origin B of deflection of the rotational polygonal mirror 17 through the PLZT 125 and the imaging lens 16. When the beam emergent from the PLZT 111 and the beam incident on the PLZT 125 are S-polarized, a halfwave voltage is applied from the control system 4 to the PLZT 125, and therefore, the S-polarized beam incident on the PLZT 125 is converted to a P-polarized beam by the rotation of polarization plane by 90 degrees. Therefore, the beam directed to the rotational polygonal mirror 17 is P-polarized at all times.

When the mark M1 is detected, the P-polarized beam L0 emitted from the laser source 10 transmits through the PLZT 11 to which no voltage is applied. The P-polarized beam is converted to a flat beam L1 by the first cylindrical lens 14. Further, since the voltage is not applied to the PLZT 111, the P-polarized beam is transmitted therethrough without rotation of polarization plane and transmitted to the mask condenser lens 120. Subsequently, it transmits through the PLZT 125 to which no voltage is applied, and is incident on the origin B of deflection of the rotational polygonal mirror.

The laser beam L1 scanningly deflected by the polygonal mirror 17 passes through the lenses 21 and 22, and thereafter is incident on one side surface 23a of the prism 23, by which it is deflected leftwardly to the half mirror 24a and is deflected downwardly thereby. The light is passed through the polarization beam splitter 20, the intermediate lens 25a, the half mirror 24a, the aperture stop 26a and the objective lens 27a and is imaged on the mask 1, and the flat beam having illuminated the mask 1 also illuminates the wafer 2 through the projection lens 40. However, due to the chromatic aberration of the projection lens 40, the illumination area formed on the wafer 2 by the beam L1 is blurred and scattered. The beam illuminating the reticle is R polarized, but the beam incident on the wafer is circularly polarized since it has passed through the quarter wave plate in the projection lens system 40.

The beam L1 imaged on the mask 1 or the wafer 2 forms an illumination area 1 which is elongate (slit-like) extending parallel to the alignment marks M1, W1 and M2 as shown in FIG. 13(a). The alignment marks M1, W1 and M2 are, therefore, illuminated by the respective illumination areas extending in such a direction.

When the illumination area 1 scans rightwardly along the scanning line A, the illumination light is scatteredly reflected by the alignment marks M1. The output signal S1 shown in FIG. 13(b) is obtained by the light MD scatteredly reflected by the mark M1 which returns through the objective lens 27a and the aperture stop 26a (FIG. 11) and reflected by the half mirror 34a and reaching the photoelectric transducer 39a by way of the polarization beam splitter 35a, the imaging lens 36a, the partial light blocking plate 37a and the condenser lens 38a. During this scanning, even if the marks M1 and W1 are very close or even if the positional relation therebetween is opposite in the scanning direction, the possibility is very small that the mark W1 is taken for the mark M1, since the light l incident on the wafer 2 is the scattered one so that the detection signal S2' of the scatteredly reflected light by the mark W1 is very low in level and very broad. This tendency is more remarkable with the increase of chromatic aberration of the projection lens system, that is, the increase of the difference in the wavelength between the light for alignment and the light for pattern exposure. In this embodiment, the quarter wave plate in the projection lens system 40 functions to convert the beam incident on the wafer 2 to a circularly polarized beam, and also to convert the light scatteredly reflected by the mark W1 to a linearly polarized (S-polarized) beam so as to be reflected by the beam splitter 35a. In this manner, the beam from the mark W1 is prevented from entering the second photoelectric detecting system.

The output signal S1 of the photoelectric transducer 39a is inputted to the wave shaping circuit 71 of the control system 4, where the signal is cut at a predetermined slice level, a rectangular pulse P1 as shown in FIG. 13(d) is formed with the pulse width equal to the width of the signal S1 at the slice level. The pulse P1 is transmitted to the counter circuit 72 and the processing circuit 74. The counter circuit 72 transmits the pulse signal to the control circuit 75, which produces, in response thereto, inclination and imaging point switching signals to the driver circuit 76 so as to apply the halfwave voltage to the PLZT 111 and the PLZT 125. The PLZT 111 rotates by 90 degrees the polarization plane of the flat beam L1 (P-polarized) from the polarization beam splitter 15, thus converting it to an S-polarized beam. The polarization beam splitter 119 reflect the S-polarized beam, thereby switching the optical path of the beam L1, and direct the beam to the wafer condensing lens 122 through the reflection mirror 121. Therefore, the flat beam 1 is imaged on the wafer 2.

When the flat scanning beam scans along the scanning line A rightwardly, the beam is scattered at a position corresponding to the alignment mark W1. The output signal S2 as shown in FIG. 13(c), is produced by the light MW scattered by the alignment mark W1 which returns through the projection lens system 40, the objective lens 27a, the aperture stop 26a, the half mirror 34a and the intermediate lens 25a (FIG. 11) and is reflected by the polarization beam splitter 20a and thereafter is directed to the photo-electric transudcer 33a by way of the imaging lens 30a, the partial light blocking plate 31a and the condenser lens 32a. Since the illumination area by the flat beam 1 on the mask 2 is blurred and scattered, the signals S1' or S3' produced by the light MD directly reflected by the mask 2 is very low in level and very broad. Therefore, even if the mark M1 or M2 is erroneously scanned, the possibility is very low that this is taken for the mark W1. Also, since the direct reflected light MD is P-polarized, it is prevented from passing through the polarization beam splitter 20 and entering the first photoelectric optical system substantially completely.

Figure 13:
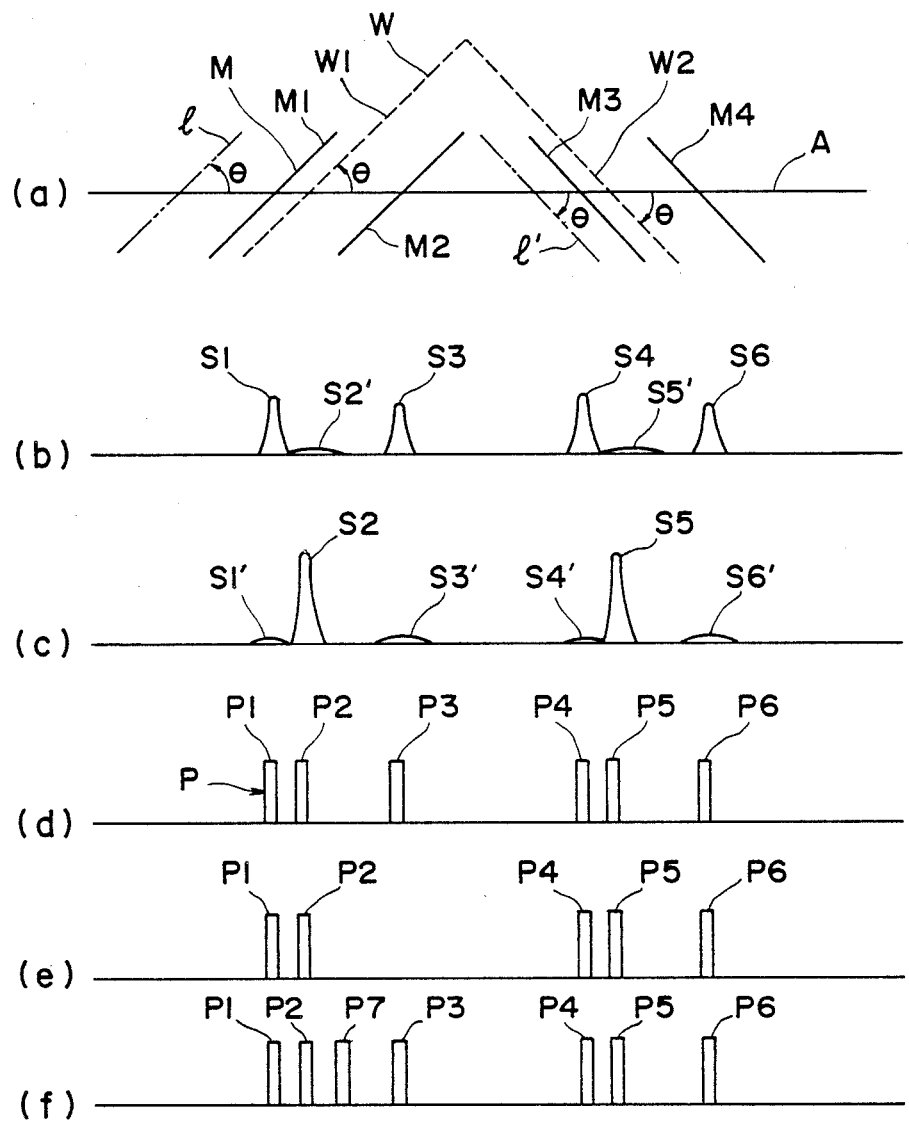
FIG. 13 is a schematic view showing alignment marks and the manner of detecting the same, according to the embodiment of the present invention as illustrated in FIG. 11.

The output signal S2 of the photoelectric transducer 33a is reformed into a rectangular pulse P2 as shown in FIG. 13, (d) by the wave shaping circuit 71 of the controller 4 and is transmitted to the counter circuit 72 and the processing circuit 74. The counter circuit 72 transmits the pulse signal to the control circuit 75, which produces, in response thereto, inclination and imaging point switching signals to the driver circuit 76 so as to shut off the voltage to the PLZT 111 and the PLZT 125. This is the same as in the scanning operation for the mark M1. The flat beam L is imaged on the mask 1, and it scans the mark M2 to detect it.

Since the illumination area 1 substantially overlaps along the alignment marks M1, W1 and M2, the accuracy of detection is improved as compared with the case of a spot beam. The non-scattered light reflected by the flat surface of the mask 1 and that of the wafer 2 is imaged on the central part of the partial light blocking plate 31a or 37a, so that it does not reach the photoelectric transducer 33a.

After this mark M2 has been scanned, the control circuit 75 of the controller 4 applies to the driver circuit 76 inclination and imaging point switching signals so that the PLZT 11 and the PLZT 111 receive the halfwave voltage. By this, the PLZT 111 rotates by 90 degrees the polarization plane of the P-polarized beam from the laser source 10, thus converting it to an S-polarized beam. The polarization beam splitter 12 reflects the S-polarized beam, thereby switching the optical path of the laser beam, and directing the beam to the second cylindrical lens 19 by way of the reflecting mirror 18. Since the second cylindrical lens 19 is inclined at a predetermined angle with respect to the first cylindrical lens 14, the inclination of the illumination area of the flat beam changes on the mask 1 and the wafer 2. Therefore, the illumination area is inclined parallel to the marks M3, W2 and M4 as shown by the reference l' in FIG. 13(a). At this time, the halfwave voltage is applied to the PLZT 111, the S-polarized beam from the second cylindrical lens 19 is converted to a P-polarized beam by the PLZT 111, so that the beam is introduced into the mask condenser lens 120, with the result that the flat beam is imaged on the mask 1.

When the PLZT 111 is turned off, and the PLZT 125 is turned on, while the voltage is kept applied to the PLZT 11 (on), the laser beam L2 is introduced into the wafer condenser lens 120, so that the beam is imaged on the wafer 2. Then, the PLZT 111 is turned on, and the PLZT 125 is turned off with the PLZT 11 being kept on, so that the beam is imaged on the mask 1.

The alignment marks M3, W2 and M4 are scanned by the slit-like illumination area l'. The photoelectric transducers 39a and 33a produce output signals S4, S5 and S6 as shown in FIG. 13(b) and (c) which are reformed into the rectangular pulses P4, P5 and P6 as shown in FIG. 13(c) by the wave shaping circuit 71. In this manner, the detection of the first alignment mark group is accomplished. Those pulses P4, P5 and P6 are processed together with the already detected pulses P1, P2 and P3 at the time when it is necessary.

The laser beam L is further deflected by the polygonal mirror 17 and reaches the other side surface 23b of the prism 23. Then, the beam L is transmitted through the reflecting mirror 24b, the polarization beam splitter 20b, the intermediate lens 25b, the half mirror 34b, the aperture stop 26b and the objective lens 27b so as to be incident on the mask 1 and the wafer 2 to detect the second alignment mark groups thereon in the similar manner as described above.

When the mark positions are searched prior to the above-described alignment mark detecting operations, the scanning operation may be effected by the illumination area of only one of the beams, for example, the beam L1, which has been used to detect the marks M1 and M2 and which is imaged on the mask 1, as in the foregoing embodiment.

The present invention is not limited to the above described embodiment. For example, in the foregoing embodiment, the flat beam is used for the scanning beam, but the present invention is effective when a spot beam is used. In this embodiment, the quarter wave plate is disposed between the mask and the wafer so as to further distinguish the light directly reflected by the mask and the light reflected by the wafer, in order to meet the case where the pattern exposure light and the alignment light are relatively close in wavelength, as in the case where an extra-high voltage mercury-vapor lamp is used for the pattern exposure light, and a He-Ne laser or He-Cd laser is used for the automatic alignment light. When, for example, an excimer laser is used for the pattern exposure light, and the He-Ne laser is used for the alignment light (the wavelengths are fairly different), the distinction is satisfactorily clear only by the exchange of the imaging point. Therefore, the quarter wave plate and the polarization beam splitters 35a and 35b may be omitted. Further, it is possible to replace the polarization beam splitter 20a and 20b by half mirrors.

The power of each of the condenser lenses 120 and 122 is determined in consideration of the wavelength of the pattern exposure light and that of the alignment light. It is possible to use as the condenser lenses 120 and 122 a variable power lens so that the device is more widely usable.

In this embodiment, the scanning beam is imaged on the mask when the mark on the mask is to be scanned. However, it is possible that the imaging point is fixed on the wafer, particularly in the case of reduction projection system. In this case, the mark on the mask is always scanned by a blurred illumination area. Since, however, the positional accuracy on the mask is reduced on the wafer in accordance with the reducing magnification, a satisfactory accuracy can be provided, particulary when the chromatic aberration difference is relatively small between the pattern exposure light and the alignment light. The laser beam imaging point switching optical system constituted by the polarization beam splitters 119 and 124, the condenser lenses 120 and 122 and the polarization plane rotating elements 111 and 125 is preferably disposed before the rotational polygonal mirror 17 from the structure standpoint, as in this embodiment. However, from the standpoint of its function, it is not necessary. The condenser lenses 120 and 122 may be provided at the positions of the cylindrical lenses 14 and 19.

Further a better alignment signal detection can be accomplished by replacing the second photo-electric detecting optical system of FIG. 11 comprising the imaging lenses 30a and 30b, the partial light blocking plates 31a and 31b, the condenser lenses 32a and 32b and the photoelectric transducers 33a and 33b, with the detecting optical system of FIG. 7 comprising the imaging lenses 30a and 30b, the polarization plane rotating elements 131a and 131b, the polarization beam splitter 132a and 132b, the spatial filters 136a, 136b, 137a and 137b, the condenser lenses 134a, 134b, 137a and 137b and the photoelectric transducers 135a, 135b, 138a and 138b. In this case, the polarization plane rotating elements are controlled in synchronism with the other elements by the controller 4.

As described in the foregoing, this embodiment relates to an apparatus wherein the marks (original) of the mask and wafer (photosensitive member) interposing therebetween a refraction optical system are scanned and detected with a light beam having a wavelength which is different from that of the light for the pattern exposure, it employs the arrangement wherein the scanning beam is sharply imaged only on the position where the mark is to be detected. Because of this, the scanning beam can be reduced further so that the accuracy of the mark detection is improved. Moreover, the chromatic aberration of the projection optical system is positively used, whereby the interference between the light directly reflected by the mark of the mask and the light reflected by way of the wafer can be prevented, and therefore, the detection accuracy is further improved. Furthermore, when the switching of the imaging point is executed electrically, it is not necessary to move the wafer and/or another member after or before the mark detection, and therefore, the speed of alignment operation is increased.

While the invention has been described with reference to the structure disclosed herein, it is not confined to the details set forth and this application is intended to cover such modifications or changes as many come within the purposes of the improvements or the scope of the following claims.

What is claimed is:

1. A detecting apparatus for detecting an alignment mark formed on an original and an alignment mark formed on a member disposed at a position optically conjugate with the original with respect to a wavelength of light for exposing the member to a pattern of the original through a projection lens, said apparatus comprising:

scanning means for scanning the alignment marks of the original and the member with a light beam having a wavelength which is different from that of the exposing light, wherein the alignment mark of the member is scanned by the light beam after the light beam has passed through the projection lens;

detecting means for receiving light from the original and the member and for detecting the alignment marks of the original and the members; and shifting means for shifting an imaging position of the light beam scanning the original and the member in a direction of an optical axis of the projection lens so that the light beam is imaged on the original when the alignment mark of the original is to be detected, and so that the beam is imaged on the member when the alignment mark of the member is to be detected.

2. An apparatus according to claim 1, wherein said shifting means is also operable for acting on the light beam to selectively focus the beam on the original and on the member during one scan by said scanning means.

3. An apparatus according to claim 1, wherein said detecting means includes a filter for directing only scattered light scattered by the original and scattered light scattered by the member to a photodetector to convert the scattered light to respective electric signals.

4. An apparatus according to claim 3, wherein said photodetector includes a first light receiving element for receiving the light scattered by the original and a second light receiving element for receiving the light scattered by the member.

5. An apparatus according to claim 1, wherein said scanning means includes a deflector for receiving and deflecting the light from a light source for providing the light beam, said shifting means being disposed between the light source and the deflector.

6. A detecting apparatus for detecting an alignment mark formed on a mask and an alignment mark formed on a wafer disposed at a position optically conjugate with the mask with respect to a wavelength of light for exposing the wafer to a pattern of the mask, through a projection lens, said apparatus comprising:

scanning means for scanning the alignment marks of the mask and the wafer with a light beam having a second wavelength which is different from that of the exposing light, wherein the alignment mark of the wafer is scanned by the light beam after the light beam has passed through the projection lens;

a light source for providing the light beam having the second wavelength;

shifting means, disposed between said light source and said scanning means, for shifting an imaging position of the light beam scanning the mask and the wafer in a direction of an optical axis of the projection lens;

control means for controlling said shifting means, said shifting means being operable in a first state to image the light beam on the mask so that it is out of focus on the wafer when the alignment mark of the mask is to be detected, and a second state to image the light beam on the wafer so that it is out of focus on the mask when the alignment mark of the water is to be detected; and detecting means for receiving light from the mask in the first state and light from the wafer in the second state, to detect the alignment marks of the mask and the wafer.

7. An apparatus according to claim 6 wherein said detecting means includes filter means for directing only light scattered by said mask and wafer to a photoconductor to convert the light received thereby to electric signals.

* * * * *

UNITED STATES PATENT AND TRADEMARK OFFICE
CERTIFICATE OF CORRECTION

PATENT NO. : 4,937,459

DATED : June 26, 1990

INVENTOR(S) : HIDEKI INA, ET AL.

It is certified that error appears in the above-identified patent and that said Letters Patent is hereby corrected as shown below:

COLUMN 1

Line 16, "wafer" should read --wafer.--.

COLUMN 10

Line 17, "now" should be deleted.

COLUMN 26

Line 25, "FIG. 13, (d)" should read --FIG. 13(d)--.

COLUMN 28

Line 51, "many" should read --may--.

COLUMN 29

Line 3, "members;" should read --member;--.

Signed and Sealed this

Twenty-fifth Day of August, 1992

Attest:

DOUGLAS B. COMER

Attesting Officer    Acting Commissioner of Patents and Trademarks